(12) United States Patent
McGregor et al.

(10) Patent No.: US 6,175,120 B1
(45) Date of Patent: Jan. 16, 2001

(54) HIGH-RESOLUTION IONIZATION DETECTOR AND ARRAY OF SUCH DETECTORS

(75) Inventors: Douglas S. McGregor, Ypsilanti, MI (US); Ronald A. Rojeski, Pleasanton, CA (US)

(73) Assignees: The Regents of The University of Michigan, Ann Arbor, MI (US); Sandia Corporation, Albuquerque, NM (US)

( * ) Notice: Under 35 U.S.C. 154(b), the term of this patent shall be extended for 0 days.

(21) Appl. No.: 09/075,351

(22) Filed: May 8, 1998

Related U.S. Application Data

(60) Provisional application No. 60/052,092, filed on Jul. 10, 1997.

(51) Int. Cl.[7] .................................................. H01L 31/115

(52) U.S. Cl. ................................ 250/370.13; 250/370.06

(58) Field of Search ........................... 250/370.13, 370.06

(56) References Cited

U.S. PATENT DOCUMENTS

| | | |
|---|---|---|
| 5,391,882 | 2/1995 | Rhiger . |
| 5,530,249 | 6/1996 | Luke . |
| 5,627,377 | 5/1997 | Hamilton, Jr. et al. . |
| 5,677,539 | 10/1997 | Apotovsky et al. . |
| 5,777,338 | 7/1998 | He . |

OTHER PUBLICATIONS

H. L. Malm, C. Canali, J. W. Mayer, M–A. Nicolet, K. R. Zanio, and W. Akutagawa, "Gamma–ray spectroscopy with single–carrier collection in high–resistivity semiconductors." *Applied Physics Letters*, vol. 26, No. 6, pp. 344–346, Mar. 1975.*

D.S. McGregor, Et Al., Single Charge Carrier Type Sensing With A Parallel Strip Pseudo–Frisch–Grid CdZnTe Semiconductor Radiation Detector, Applied Physics Letters, Feb. 16, 1998, vol. 72, No. 7.

P.N. Luke, Single–Polarity Charge Sensing In Ionization Detectors Using Coplanar Electrodes, Applied Physics Letters, Nov. 28, 1994, vol. 65 No. 22.

P.N. Luke, Unipolar Charge Sensing With Coplanar Electrodes—Application to Semiconductor Detectors, IEEE Transactions on Nuclear Science, Aug. 4, 1995, vol. 42, No. 4.

(List continued on next page.)

*Primary Examiner*—Constantine Hannaher
(74) *Attorney, Agent, or Firm*—Brooks & Kushman P.C.

(57) ABSTRACT

A high-resolution ionization detector and an array of such detectors are described which utilize a reference pattern of conductive or semiconductive material to form interaction, pervious and measurement regions in an ionization substrate of, for example, CdZnTe material. The ionization detector is a room temperature semiconductor radiation detector. Various geometries of such a detector and an array of such detectors produce room temperature operated gamma ray spectrometers with relatively high resolution. For example, a 1 cm$^3$ detector is capable of measuring $^{137}$Cs 662 keV gamma rays with room temperature energy resolution approaching 2% at FWHM. Two major types of such detectors include a parallel strip semiconductor Frisch grid detector and the geometrically weighted trapezoid prism semiconductor Frisch grid detector. The geometrically weighted detector records room temperature (24° C.) energy resolutions of 2.68% FWHM for $^{137}$Cs 662 keV gamma rays and 2.45% FWHM for $^{60}$Co 1.332 MeV gamma rays. The detectors perform well without any electronic pulse rejection, correction or compensation techniques. The devices operate at room temperature with simple commercially available NIM bin electronics and do not require special preamplifiers or cooling stages for good spectroscopic results.

37 Claims, 21 Drawing Sheets-

OTHER PUBLICATIONS

Jack F. Butler, Novel Electrode Design For Single–Carrier Charge Collection in Semiconductor Nuclear Radiation Detectors, Nuclear Instruments and Methods in Physics Research A 396, 1997, p427–430.

D.S. McGregor, et a., CdZnTe Semiconductor Parallel Strip Frisch Grid Radiation Detectors, IEEE Transactions on Nuclear Science, pp. 443–449, vol. 45, No. 3, Jun. 1998.

* cited by examiner

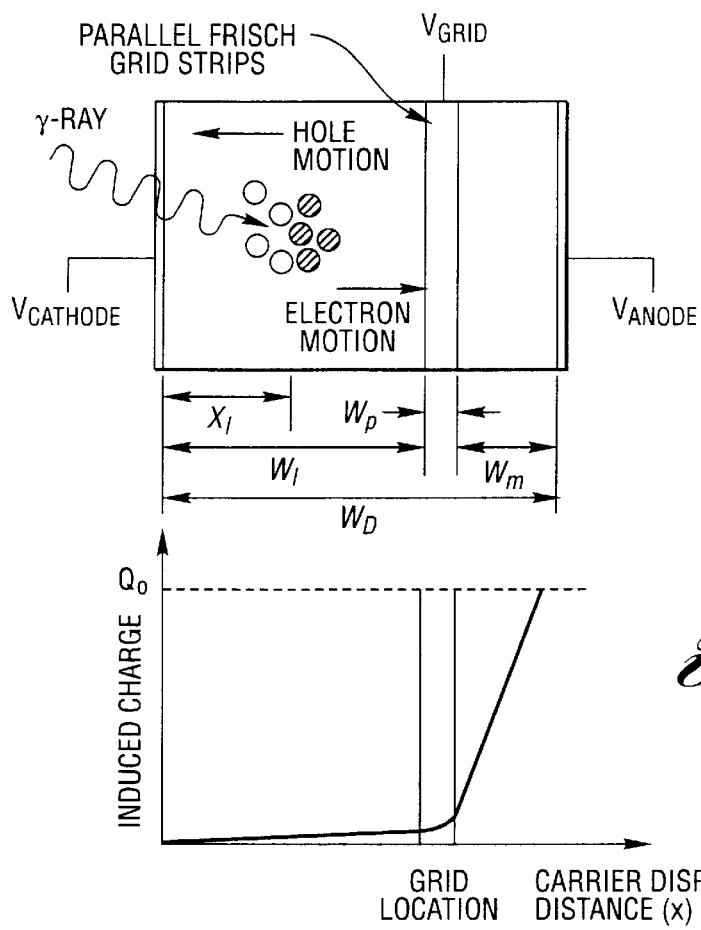
*Fig. 14a*
*Fig. 14b*
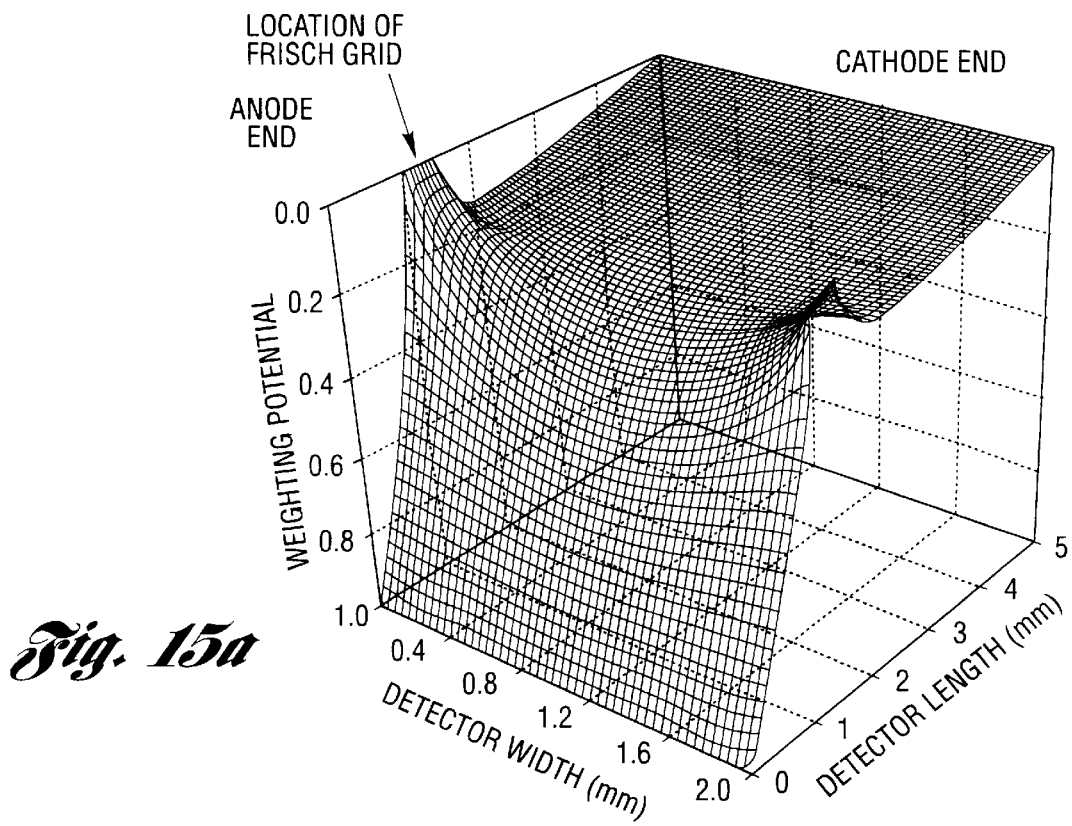
*Fig. 15a*

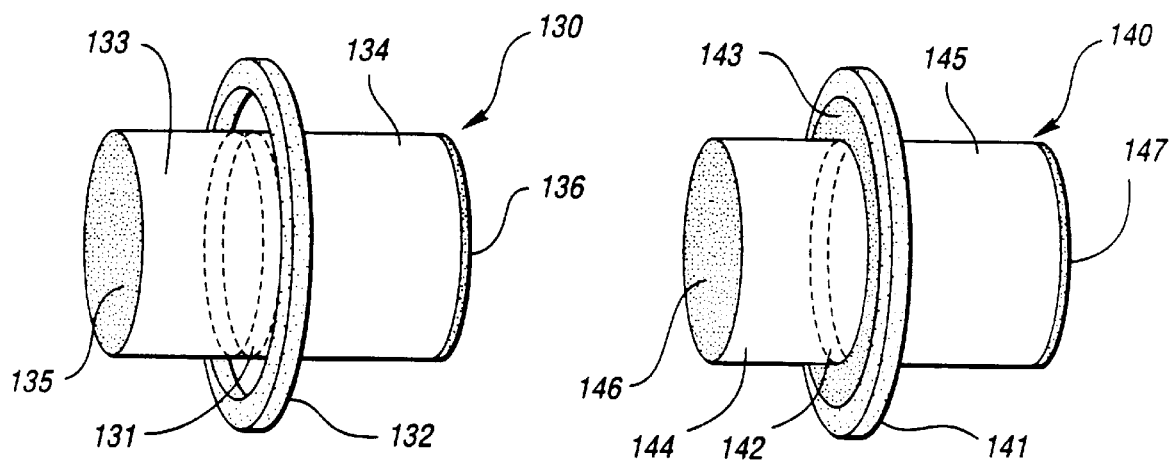
*Fig. 41*   *Fig. 42*
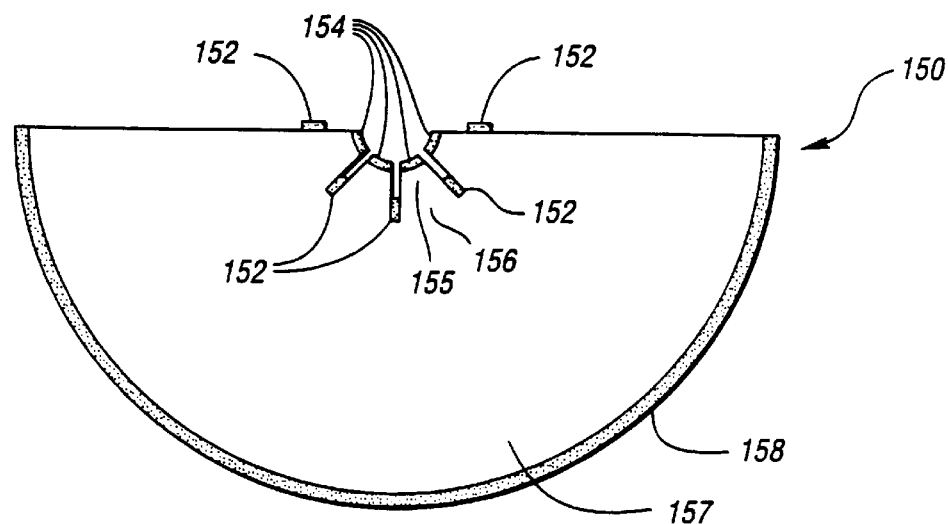
*Fig. 43*
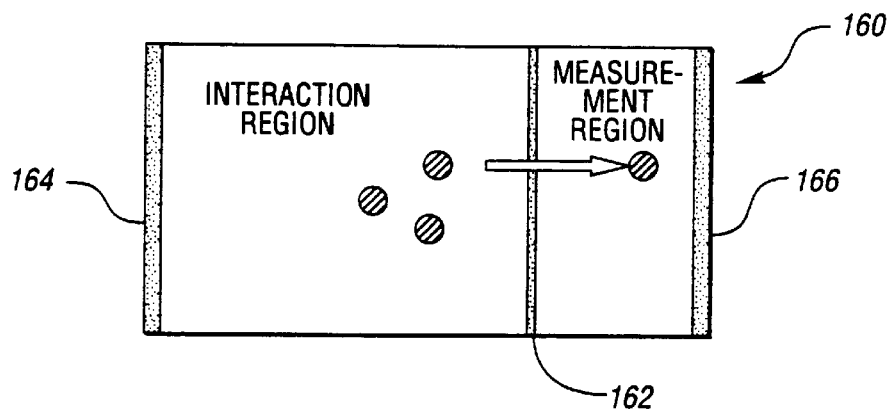
*Fig. 44*

HIGH-RESOLUTION IONIZATION DETECTOR AND ARRAY OF SUCH DETECTORS

This application claims the benefit of provisional application entitled "Semiconductor Single Charge Carrier Device or Semiconductor Single Carrier Spectrometer' filed Jul. 10, 1997 and having U.S. Ser. No. 60/052,092.

STATEMENT OF GOVERNMENT RIGHTS

This invention was at least partially made with Government support under Contract No. DE-AC04-94 AL 85000. Also, Los Alamos National Laboratory Subcontract No. 9-XGO-K7910-1 and Sandia National Laboratory Subcontract No. AV-5242. This invention was also at least partially made with government support under DOE Contract W-7405-ENG-36 and Los Alamos National Subcontract 9 XG2-Y0173-1. The Government has certain rights to this invention.

CROSS-REFERENCE TO RELATED APPLICATIONS

This application is related to copending application entitled "Ionization Detector, Electrode Configuration and Single Polarity Charge Detection Method" filed Dec. 11, 1996 and having U.S. Ser. No. 08/763,675, now U.S. Pat. No. 5,777,338, provisional application entitled "Semiconductor Single Charge Carrier Device or Semiconductor Single Carrier Spectrometer" filed Jul. 10, 1997 and having Ser. No. 60/052,092, and application entitled "Method and Apparatus for Electron-Only Radiation Detectors From Semiconductors Materials" filed on the same day as this application.

1. Technical Field

This invention relates to ionization detectors and, in particular, to high-resolution ionization detectors and an array of such detectors.

2. Background Art

Ionization detectors such as semiconductor radiation detectors have been studied since 1945, in which tiny AgCl crystals cooled to low temperatures were used to observe radiation induced electrical pulses. Such devices were impractical due to the stringent cooling requirements and their diminutive size. Semiconductor radiation detectors were interesting devices and were studied for many years, but were deemed impractical when compared to the (then) superior performance of scintillation detectors.

The introduction of Li drifting in Ge and Si by E. M. Pell provided a method to produce reasonably large Ge and Si detectors with much higher energy resolution than scintillators could achieve. Hence, single element semiconductors radiation detectors became the main devices used for high energy resolution measurements of ionizing radiation.

The remaining inconvenience to the Ge(Li) and the Si(Li) detectors is the requirement of cryogenic operating temperatures (77K). Si(Li) detectors must be cooled in order to reduce the concentration of thermally excited charge carriers that add noise to the measurement, thereby reducing the energy resolution. The case for Ge(Li) devices is much more severe, in which the crystal must remain cooled to 77K to prevent redistribution of the Li in the device (through diffusion), as well as reduce thermal noise. Ge(Li) detectors are ruined if they are allowed to warm up to room temperature, and the devices can only be re-drifted once or twice before severe gamma ray energy resolution degradation appears.

Zone refinement of Ge eventually eliminated the need for Li drifting in Ge material to produce high-energy resolution gamma ray detectors. The high purity Ge (HPGe) detectors do not need to be constantly cooled, but must be cooled to 77K during operation to reduce thermal noise and to prevent harmfully high leakage currents from passing though the detector. Hence, the cryogenic requirement remains. Float zone refinement of Si also has worked to produce high quality material for charged particle detectors, but Si based X-ray detectors are still manufactured from Li drifted material.

Overall, the inconvenient cryogenic operating condition required for Ge and Si radiation detector operation has severely limited their use, and remotely operated devices are still manufactured mainly from scintillators. Also, the gamma ray absorption efficiency of Ge and Si are tremendously less than that of inexpensive and readily available scintillators such as NaI(Tl). The case is much worse when one considers that NaI(Tl) material can be obtained in sizes greater than 2 feet in diameter and several inches thick, whereas the largest commercially available HPGe detectors are only 5 inches in diameter and perhaps 5 inches thick. Additionally, the cost of such a large HPGe device could shock even the most dedicated gamma ray spectroscopist into preferring a NaI(Tl) detector when gamma ray efficiency is the primary concern.

One method to increase intrinsic gamma ray interaction efficiency in a semiconductor radiation detector is to utilize semiconductors composed of relatively high atomic number elements. Such a condition becomes practical only if the material of choice is available in reasonably large volume. A method to reduce the cryogenic cooling requirement is to use a semiconductor with a relatively large band gap (1.4 eV–2.5 eV) such that the concentration of thermally produced charge carriers is minimal at room temperature. Hence, a reasonably competitive semiconductor material for a room temperature operated gamma ray spectrometer would be composed of materials with high Z values and have a wide band gap. The only single element semiconductors are carbon (diamond—C), silicon (Si), germanium (Ge) and tin (Sn). Carbon does not satisfy the high Z requirement, and Si does not satisfy the band gap requirement or the high Z requirement. Ge barely meets the Z requirement with its atomic number of 32, but fails the band gap energy requirement, and Sn has overlapping conduction and valence bands that makes it perform as a conductor rather than a semiconductor. As a result, the only choices that remain for room temperature operated semiconductor radiation detectors are compound semiconductors.

The search for a semiconductor material to operate as a room temperature gamma ray spectrometer has been conducted for many decades and only recently have promising results been observed. W. J. Price's initial concerns were valid, and he remains correct in his assumptions regarding compound semiconductor radiation detectors to this very day. Imperfections and charge carrier "traps" impede detector performance and cause undesirable degradation in the observed energy resolution. To reduce trapping effects, compound semiconductor radiation detectors have been manufactured to be very small, on the order of a few tens of microns to a few millimeters in thickness. Such devices are generally considered interesting novelties, yet have only practical applications where tiny room temperature operated radiation detectors are required. The major difficulty with charge carrier extraction from a semiconductor radiation detector is the misbalance of hole charge carrier characteristics with that of electron charge carrier characteristics.

Generally, holes suffer from trapping losses much more than electrons, and the resulting position dependent charge collection characteristics cause severe energy resolution degradation.

CdZnTe material only recently has become commercially available, and the material showed promise as a possible room temperature operated gamma radiation spectrometer. With a band gap near 1.6 eV and material atomic numbers of 48, 30 and 52, CdZnTe has the fundamental properties required for a room temperature operated semiconductor detector. Permutations of the single polarity electron sensing idea have been realized with CdZnTe material with interesting results. For instance, the co-planar grid concept allowed for the realization of fairly high-resolution CdZnTe detectors at room temperature with energy resolution of 3.7% FWHM at 662 keV for a 5 mm×5 mm×5 mm device (125 mm$^3$) as described in the U.S. patent to Luke U.S. Pat. No. 5,530,249. These results placed much attention on the co-planar design, in which two series of serpentine patterned parallel anode electrodes were biased at different voltages on one surface and a large single cathode electrode was biased on the opposite surface. The claim that a Frisch grid could not be made on or in a semiconductor was announced as well by Luke.

Later results using the co-planar single polarity device sensing concept demonstrated 3.4% FWHM at 662 keV for another 5 mm×5 mm×5 mm device (125 mm$^3$) as described in the above-noted application Ser. No. 08/763,675. Yet, due to imbalances in the induced charge "weighting distribution" of the co-planar devices and the remaining effect of electron trapping, higher energy resolution was not observed. With electronic correction techniques, a 1 cm$^3$ CdZnTe co-planar detector with 1.79% FWHM at 662 keV has been demonstrated.

A permutation of the co-planar idea is described in U.S. Pat. No. 5,677,539, in which a single dot electrode was put on one surface and surrounded by what is referred to as a "control electrode". The device is biased similarly to the co-planar device, and has shown resolution of 5% FWHM or better at 662 keV for a 3 mm×3 mm×3 mm detector (27 mm$^3$). The device geometry has demonstrated reasonable gamma ray energy resolution only for devices 125 mm$^3$ in volume or less.

SUMMARY OF THE INVENTION

An object of the present invention is to provide an improved ionization detector and an array of such detectors having improved energy resolution (i.e. measurement accuracy) without the need for electronic pulse rejection compensation and correction techniques.

Another object of the present invention is to provide an improved ionization detector and an array of such detectors which are relatively inexpensive to make and are operable at room temperature.

Still another object of the present invention is to provide a Frisch grid semiconductor radiation detector and an array of such detectors wherein only a single standard charge-sensitive pre-amplifier need be provided without the need for a custom pre-amplifier or coupling circuit in a measuring circuit.

Yet still another object of the present invention is to provide a true, single-carrier sensitive, semiconductor Frisch grid detector and an array of such detectors.

In carrying out the above objects and other objects of the present invention, a high-resolution, ionization detector is provided. The detector includes an ionization substrate having a first surface and a second surface opposing the first surface, a first electrode disposed at the first surface and a second electrode disposed at the second surface. The detector also includes a reference pattern of conductive or semi-conductive material which divides the ionization substrate into an interaction region, a measurement region and a pervious region which separates the interaction and measurement regions. The pervious region defines a reference plane to measure charge carrier movement in the measurement region and directs charge carrier flow within the substrate. Voltage potential circuits apply voltage potentials to the reference pattern of material and to the first and second electrodes so that a bias voltage is applied across substantially the entire substrate and so the voltage potential applied to the reference pattern is between the voltage potentials applied to the first and second electrodes. Charge carriers of a first polarity type move from the interaction region, through the pervious region and into the measurement region. The detector further includes a signal measurement circuit for measuring at the second electrode or signal generated by the charge carriers of the first polarity type moving from the interaction region, through the pervious region and within the measurement region between the pervious region and the second surface.

Preferably, the reference pattern is a grid such as a Frisch grid having at least two substantially parallel strips of conductive or semi-conductive material.

In one embodiment, the substrate also has a third surface and a fourth surface opposing the third surface between the first and second surfaces and wherein the Frisch grid is a Frisch grid ring disposed at the third and fourth surfaces.

In another embodiment, the reference pattern includes a first strip disposed at the third surface and a second strip disposed at the fourth surface.

In the two embodiments, the ionization detector is a semiconductor, single-charge carrier, radiation detector wherein the semiconductor substrate is a semiconductor substrate which operates as a room temperature, gamma ray detector.

The signal measurement circuit may include a single preamplifier circuit.

The first electrode can be substantially larger than the second electrode to take advantage of the "small pixel" effect.

The substrate may be shaped like a trapezoid, a pyramid frustum, a conical frustum, or any other shape where the substrate is geometrically weighted.

The first surface may be curved to allow for more uniformity with charge carrier transport within the interaction region.

In another embodiment, the second surface has a plurality of trenches formed therein separated by towers wherein the reference pattern is formed in the trenches and the second electrode is formed on the towers so that the reference pattern is a Frisch grid.

Further in carrying out the above objects and other objects of the present invention, an array of detectors is provided. In one embodiment, the substrates of the detectors are formed from a single crystal or amorphous material.

In another embodiment, an array of the detectors has the substrates of the detectors formed from separate crystals or amorphous materials. The detectors may be arranged so that the array forms a substantially coaxial or spherical device.

The semiconductor Frisch grid radiation detector has three distinct regions which are labeled (1) the interaction region, (2) the pervious region, and (3) the measurement region.

The interaction region of the semiconductor Frisch grid detector is typically the largest of the three regions. It is larger than the measurement region in volume and it is typically larger than the pervious region in volume. The interaction region may be larger than the combined volume of both the measurement region and the pervious region. The main function of the interaction region is to provide volume or mass for forms of ionizing radiation to interact within.

Ionizing radiation include (1) electromagnetic waves and photons, such as gamma rays and X-rays, (2) charged particles, such as alpha particles, heavy ions, beta particles, positrons, and electrons, and (3) neutrons.

Ionizing radiation that interacts within the interaction region excites electron-hole pairs in the materials such that both types of charge carriers become mobile and freely conducting. Applied voltage or electric field allows for the electrons to be driven toward one direction and the holes in another. Depending on the type of material, the voltage may be applied such that the electrons or holes are driven toward the pervious region and measurement region.

The pervious region acts as a reference plain for charge carriers (electrons or holes) to be driven through. The pervious region is the location of the Frisch grid, which acts as the reference plane by which the induced charge is measured as charge carriers transit between the pervious region center through the measurement region to the measurement region contact. The pervious region Frisch grid may be applied through contacting or non-contacting outside contacts, through an embedded or buried structure, through a thin porous structure, or through a trenched structure.

The pervious region will typically be smaller than the interaction region in volume. The pervious region may be smaller than the measurement region volume, the same volume as the measurement region volume, or a greater volume than the measurement region volume. The pervious region will most likely be formed of the same material as the interaction and measurement region, but may also be formed from doped semi-conducting material or different materials than that of the interaction region and pervious region.

For instance, as an example, the interaction region may be composed of low doped p-type GaAs, the pervious region may be composed (at least partially) of AlGaAs, and the measurement region may be n-type GaAs.

The Frisch grid connected to the pervious region may be constructed by a number of different means. The Frisch grid acts as a reference electrode to measure induced charge as free charge carriers move between it and the outer boundary of the measurement region. Examples of implementing a Frisch grid with the pervious region are as follows:

A. The Frisch grid is formed through outside contacts. In such a case, an outer electrode is fabricated onto a material or semiconductor such that an external electrode is fastened to the device. The external electrode(s) may be a set of parallel conductive strips connected to the pervious region. The external electrode may be a continuous contact that forms concentrically around the pervious region. The external electrode(s) may be a broken line of conductive strips that are in contact with the pervious region (FIG. 35). The external electrode may be composed of a metal substance or a semiconductor substance. The external electrode(s) may be an ohmic contact or a rectifying contact composed of n-type or p-type material.

B. The Frisch grid is formed by a pattern of trenches or depressed regions with conducting material or semiconducting material in the trenches or depressed regions (FIGS. 34, 37a–c, 38, 43). The pervious region is the region adjacent the Frisch grid. Charge carriers are driven from the interaction region, through the trenches or depressed region pervious grid and into the measurement region(s). The grid may be formed with metallic electrodes or from semiconducting material. The semiconducting material may be p-type or n-type. The grid may form a rectifying contact to the bulk material, thereby reducing leakage current and charge carrier losses into the grid.

C. The Frisch grid is formed through outside conductors that are not in intimate contact with the detecting material (FIGS. 39, 40, 41, 42). The outside non-contacting Frisch grid may be composed of conducting plates adjacent to the pervious region (FIGS. 39, 40) or a concentric conducting electrode (FIGS. 41, 42) surrounding the pervious region. The scheme uses a conductive ring or concentric electrode that is not in direct contact with the detector material as the Frisch grid around the pervious region. The space between the Frisch grid ring or concentric contact may be filled with a vacuum, air, or an insulating material (FIGS. 40, 42). The insulating material may be in intimate contact with the detecting material.

D. The Frisch grid is formed through a buried conductive grid region (i.e. FIG. 3). The metallic or semiconducting grid region is buried in the device and acts as the Frisch grid. The pervious region is the non-grid region plane in which the grid lies. The buried grid may be formed by a number of different means including diffusion, ion drifting, ion implantation, chemical vapor deposition growth and any of the various means of epitaxial growth.

E. The Frisch grid is formed through a very thin film of conducting or semiconducting material that is buried in the detector (FIG. 44). The device has a membrane or plane of conducting or semiconducting material that is very thin, on the order of only a few atomic spacings. The plane acts as both the pervious region and the Frisch grid reference plane. Charge carriers are accelerated toward the plane from within the interaction region. Their high velocity allows them to punch through or tunnel through the very thin plane and into the measurement region.

The measurement region acts as the region in which free charge carriers (electrons or holes) excited by ionizing radiation are swept into by an electric field. The measurement region is the region in which the main portion of induced charge is measured as charged carriers move through its volume to the measurement region boundaries. The measurement region volume is designed to be smaller than the interaction region volume.

For a semiconductor Frisch grid radiation detector, the main portion of induced charge signal is induced on the signal electrode as free charge carriers leave the pervious region and enter into the measurement region. As a result, the ratio of the combined volumes of the pervious region and interaction region should be greater than the measurement region volume. The following volumes will be designated as follows:

Interaction region volume=$V_i$
Pervious region volume=$V_p$
Measurement region volume=$V_m$ Detector energy resolution improvement over the basic planar detector design will be noticeable for devices in which the interaction region and pervious region compose 50% or more of the detector volume. The ratio of the $V_i+V_p$ should be greater than or equal to $V_m$, or $$\frac{V_i + V_p}{V_m} \geq 1.0$$

This condition holds true for all geometries of the device, including parallelepipeds, trapezoid prisms, prisms, conical frustums, pyramid frustums, and cylinders.

The geometrically weighted semiconductor Frisch grid detector uses three fundamental effects to increase the radiation energy resolution. The design uses the:

A. Geometrical Weighting Effect

The shape of the device is tapered such that one end is larger than the other. An electrode or an array of electrodes are placed on the small end. An electrode or an array of electrodes are placed at the large end. The shape of the device increases the overall volume while also increasing the ratio of $$\frac{V_i + V_p}{V_m} \geq 1.0$$

to a number much greater than 1.0. Statistically, the number of charge carriers originating in the interaction region and moving toward the measurement region are much greater than the number of opposite polarity charge carriers originating in the measurement region and moving toward the interaction region.

B. Small Pixel Effect

More charge is induced on the small end for the small contact than the large end near the large contact. That is, charge carriers moving in the close vicinity of the small contact induce more charge than charge carriers moving in the close vicinity of the large contact. Hence, more charge is induced for carriers that pass through the Frisch grid into the region near the small contact.

C. Frisch Grid Effect

A Frisch grid is implemented using one of the previously described techniques nearest the small end of the device. The Frisch grid acts to screen charge carrier motion in the interaction region.

The angle of the device can range from 0 degrees, which describes a basic planar type semiconductor Frisch grid radiation detector, to a very wide angle up to 180 degrees (FIG. 43). The wider the angle, the more difficult the Frisch grid is to implement. For instance, prototype devices have a small end angle θ of 45° that perform very well. The devices can have small end angles that increase up to 90° and still perform well with the outside contact style Frisch grid device structure described above. Increasing the angle above 90° to a range between 90° and 180° will still produce a working three region device, yet the effective screening of the Frisch grid diminishes as the angle increases for a wide angle device as described above. Rounding the bottom of the geometrically-weighted device improves performance by reducing deviation in the transit length of charge carriers moving from the far cathode region (FIG. 33).

The above objects and other objects, features and advantages of the present invention are readily apparent from the following detailed description of the best mode for carrying out the invention when taken in connection with the accompanying drawings.

BRIEF DESCRIPTION OF THE DRAWINGS

FIGS. 14a and 14b show the interaction region is much larger than the measurement region; as a result, most of the measured induced charge appears from the electrons drifted from the interaction region into the measurement region and not from electron-hole pairs excited in the measurement region, as illustrated in FIG. 14b;

FIGS. 15a, 15b, and 15c show the weighting potential distributions of three parallel strip devices with dimensions of (a) 5 mm×2 mm×5 mm, (b) 5 mm×3 mm×5 mm, and (c) 5 mm×5 mm×5 mm, respectively; the Frisch grid strips are placed 1 mm back from the anode in all cases, and the strip is 0.5 mm wide. It is clear that the Frisch grid screening is best for the thinnest detector, and poor for the cube-shaped device;

FIGS. 16a, 16b, and 16c show the weighting potential distributions of three parallel strip devices with dimensions of (a) 10 mm×2 mm×10 mm, (b) 10 mm×4 mm×10 mm, and (c) 10 mm×6 mm×10 mm; respectively; the Frisch grid strips are placed 2 mm back from the anode in all cases, and the strip is 1.0 mm wide. The Frisch grid screening is best for the thinnest device, and is even better than the 5 mm×2 mm×5 mm device as shown in FIG. 15a; the weighting potential distribution of the 10 mm×4 mm×10 mm device is substantially identical to the 5 mm×2 mm×5 mm device shown in FIG. 15a;

FIG. 41 is a perspective view of a cylindrical detector including a non-contacting Frisch grid ring;

FIG. 42 is a view similar to FIG. 41 including insulating filling or material between the pervious region and the Frisch grid ring;

FIG. 43 is a side elevational view of a wide angle (i.e. 180°) detector with an etched-style Frisch grid; and FIG. 44 is a side view of a detector of the present invention wherein the reference pattern is a membrane buried in the semiconductor substrate.

BEST MODE FOR CARRYING OUT THE INVENTION

Figure 1:
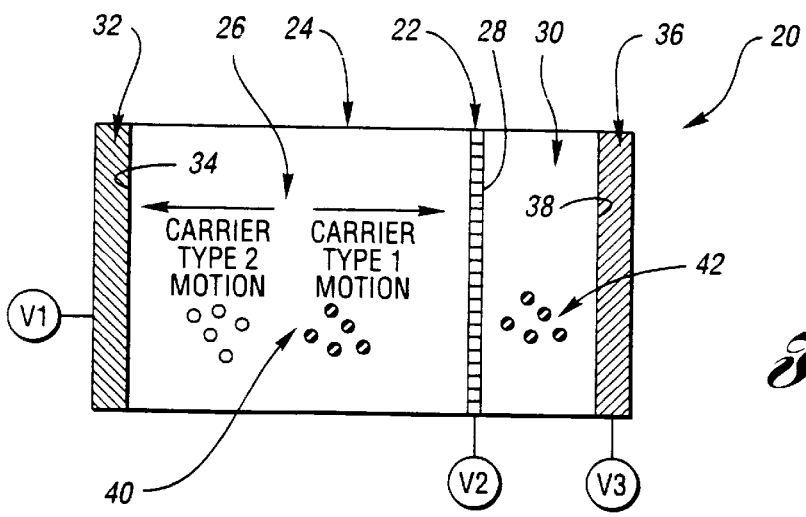
FIG. 1 is a schematic diagram of a semiconductor single carrier spectrometer (SSCS) constructed in accordance with the present invention.

Referring now to FIG. 1, there is illustrated a basic semiconductor radiation detector 20 having improved gamma ray energy resolution and which does not need to measure signals from hole charge carriers. Hence, the charge carriers that are measured are higher velocity, less trapped electrons.

The detector 20 includes a pervious or reference pattern 22 of conductive or semiconductive material based on a Frisch grid onto or into a semiconductor ionization substrate 24, thereby separating the electron and hole induced charge signals.

The reference pattern 22 divides the substrate into an interaction region 26, a pervious region 28 (i.e. under the reference pattern 22) and a measurement region 30.

The detector 20 also includes a first contact or electrode 32 disposed at a first surface 34 of the interaction region 26 and a second contact or electrode 36 disposed at a second surface 38 of the measurement region 30.

As indicated at reference numeral 40, radiation quanta interact in the interaction region 26 of the detector 20. Since the interaction region 26 is much larger than the measurement region 30, more interactions occur in the interaction region 26.

As indicated at reference numeral 42, carrier type 1 (i.e. electrons) move into the measurement region 30 and the charge is measured. Since carrier type 2 (i.e. holes) do not move into the interaction region 26, it does not contribute to the signal or measured charge.

Interactions can occur anywhere in the detector 20, but since the interaction region 26 is larger than the measurement region 30, most of the interactions occur in the interaction region 26. For gamma rays, the ratio of the interaction region volume to that of the measurement region volume gives the ratio of the number of events that occur in the interaction region 26 to that in the measurement region 30. For instance, a detector designed with the interaction region 26 being 1 cm thick and the measurement region 30 being 20 microns thick would have a ratio of 500:1, which means that for every interaction that occurs in the measurement region 30, it is expected that 500 will occur in the interaction region 26.

As previously mentioned, the two regions 26 and 30 of the detector 20 are divided by the reference pattern 22 of conductive or semiconductive material. Electron-hole pairs excited in the interaction region 26 are drifted in opposite directions, in which case one of the carrier types drift toward the reference pattern 22 and the measurement region 30 and the other carrier type drifts in the opposite direction.

A voltage is applied across the interaction region 26 and a voltage is also applied across the measurement region 30. In FIG. 1, V1, V2 and V3 represent different voltages applied at the region 26, the region 28, and the region 30, respectively. Carriers that enter the measurement region 30 induce a charge through a potential held across the measurement region 30, hence becoming the measured charge. Since only one type of carrier drifts into the measurement region 30, the other no longer contributes to the measured signal.

The detector 20 is therefore a semiconductor single charge carrier device (SSCCD) or a semiconductor single carrier spectrometer (SSCS) since it needs only to measure the charge from one type of carrier transiting in the detector 20. The detector 20 can be tailored such that the one carrier has a high CEF (i.e. "Carrier Extraction Factor") value and renders high resolution by simply altering the interaction region width.

Figure 2:
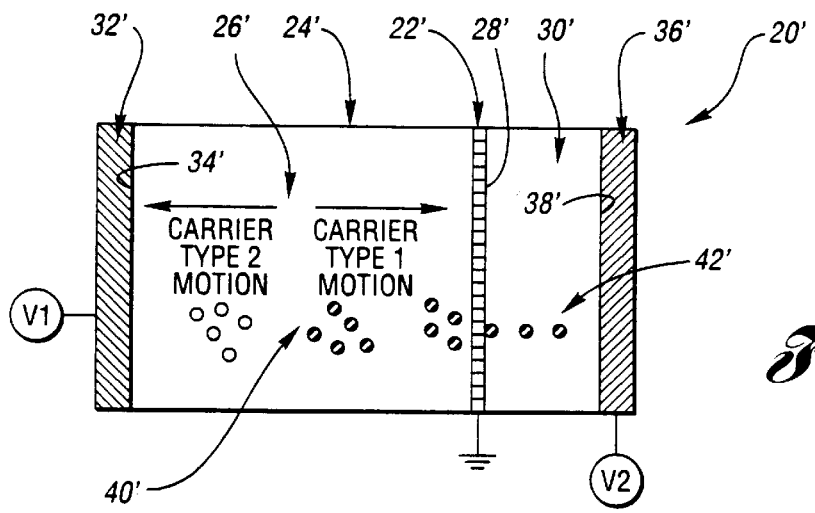
FIG. 2 is a diagram similar to FIG. 1 for use with an electron dominant device.

Referring now to FIG. 2, one such method of realizing the detector of the present invention would be to construct a two region diode as follows and as shown in FIG. 2, wherein items having the same or similar structure or function as in FIG. 1 have the same reference numeral, but a single prime designation. One side of a device 20' would be highly doped p-type material. The interaction region 26' would be lightly doped n-type material 32'. The reference pattern 22' would be highly doped p-type material and the measurement region 30' would be n-type material. Highly doped n-type material would make up the back contact 36' to the measurement region 30'.

The device 20' could also be made a number of different ways, such as replacing the above-mentioned p regions with n regions and the above-mentioned n regions with p regions. The reference pattern 22' may in fact be a metal instead of a semiconductor. It is also possible to replace region 32' and region 36' with a metal.

The SSCS Device 20' as a Radiation Spectrometer

The SSCS device 20' can be operated as a radiation spectrometer in the following fashion. A voltage is placed across the interaction region 26' and a voltage is placed across the measurement region 30'. Due to the larger volume of the interaction region 26', radiation interactions have a higher probability of occurring in the interaction region 26' than the measurement region 30'. Radiation quanta interacting in the interaction region 26', as indicated at 40', excite electron-hole pairs. The polarity of the bias voltage is placed such that the carriers with the highest CEF drift toward the measurement region 30'.

In this example, electrons are the carriers with the highest CEF although holes may be the carrier with the highest CEF as well. If the electrons are the carriers with the highest CEF, the voltage at the end contact 32' of the interaction region 26' is negative with respect to the pervious division region 28'. As a result, the electrons drift toward the pervious region 28'. The movement of charge carriers in the interaction region 26' does not need to be monitored.

As the electrons pass through the pervious region 28' they enter the voltage region between the pervious region 28' and the back contact 36' to the measurement region 30'. The potential drop is monitored as the electrons transit through the capacitance of the measurement region 30' and the induced charge is recorded. Since holes do not move into the interaction region, they do not contribute to the signal of measured charge, as indicated at 42'.

V1 is a negative voltage with respect to the pervious region 28'. The junction at region 32' and region 26' is reversed biased. V2 is a positive voltage with respect to the grid 22'. The junction at the pervious region 28' and the region 36' is reversed biased.

Hence, the measured charge is due only to electron motion and hole motion is no longer a factor, which makes the device 20' a semiconductor single carrier spectrometer. This type of device can be made such that holes are the carriers measured instead of electrons.

Figure 3:
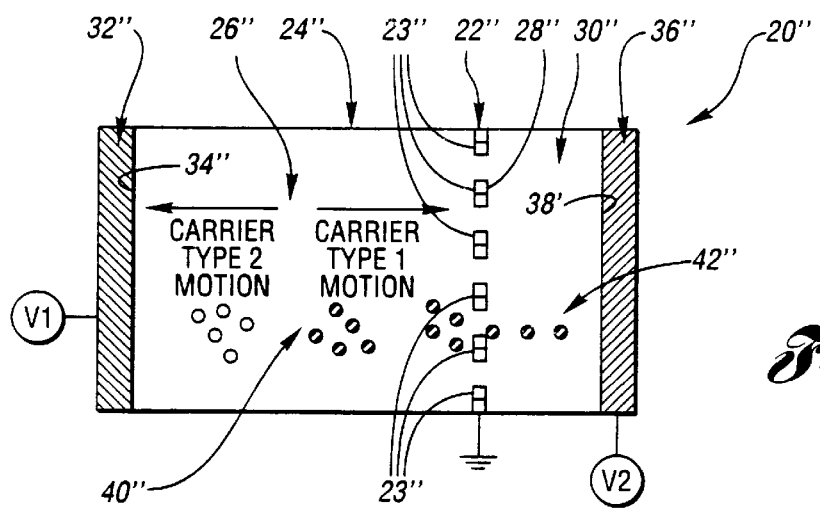
FIG. 3 is a diagram similar to FIGS. 1 and 2 for an electron,dominant device.
Figure 4:
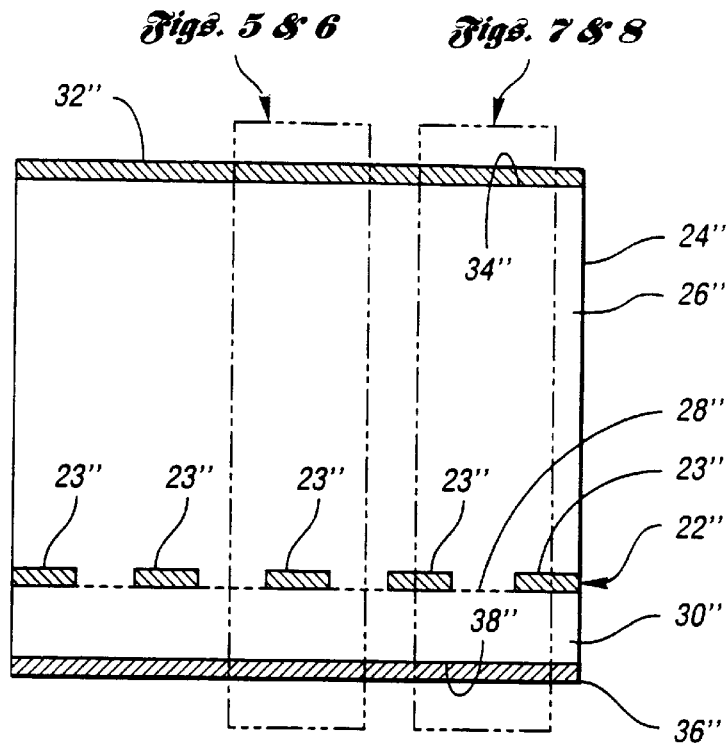
FIG. 4 is a sectional view of the detector of FIG. 3.

FIGS. 3 and 4 show one design for a semiconductor single carrier spectrometer (SSCS) 20" wherein items having the same or similar structure and/or function have the same reference numeral as in FIGS. 1 and 2, but have a double prime designation.

FIG. 3 shows the general construction of one such device. In FIGS. 3 and 4, region 22" is a highly doped p-type contact or region. Radiation interactions occur preferentially in the interaction region 26" and excite electron-hole pairs. The interaction region 26" is low doped n-type, υ-type, or intrinsic material. The pervious region 28" is composed in this example of a p-type grid 22 of lines 23" buried in the material. The measurement region 20" consists of n-type or intrinsic material. The back contact 36" is made from highly doped n-type material.

One method of operating the SSCS 20" is to hold the grid 22" at ground and apply negative voltage to region 32". Positive voltage is applied to region 36" with respect to the grid 22". Other methods can be used as well.

For instance, region 32" can be grounded, region 22" biased with positive voltage, and region 36" biased with a higher positive voltage than region 22".

Another method of accomplishing the bias may be to ground region 36", apply negative voltage to region 22", and a larger negative voltage to region 32". The basic scheme, if electrons have the higher CEF values, is to make the grid 22" more positive than region 32", and region 36" more positive than region 22".

If holes have the higher CEF, the device 20" might be designed as follows. The region 32" would be a highly doped n-type region. The interaction region 26" is low doped p-type, n-type, or intrinsic material. The pervious region 22" composed in this example of a n-type grid 22" of lines 23" buried in the material. The measurement region 30" consists of p-type or intrinsic material. The back contact 36" is made from highly doped p-type material.

The basic scheme, if holes have the higher CEF values, is to make the grid 22" more negative than the region 32", and the region 36" more negative than the region 22".

Figure 5:
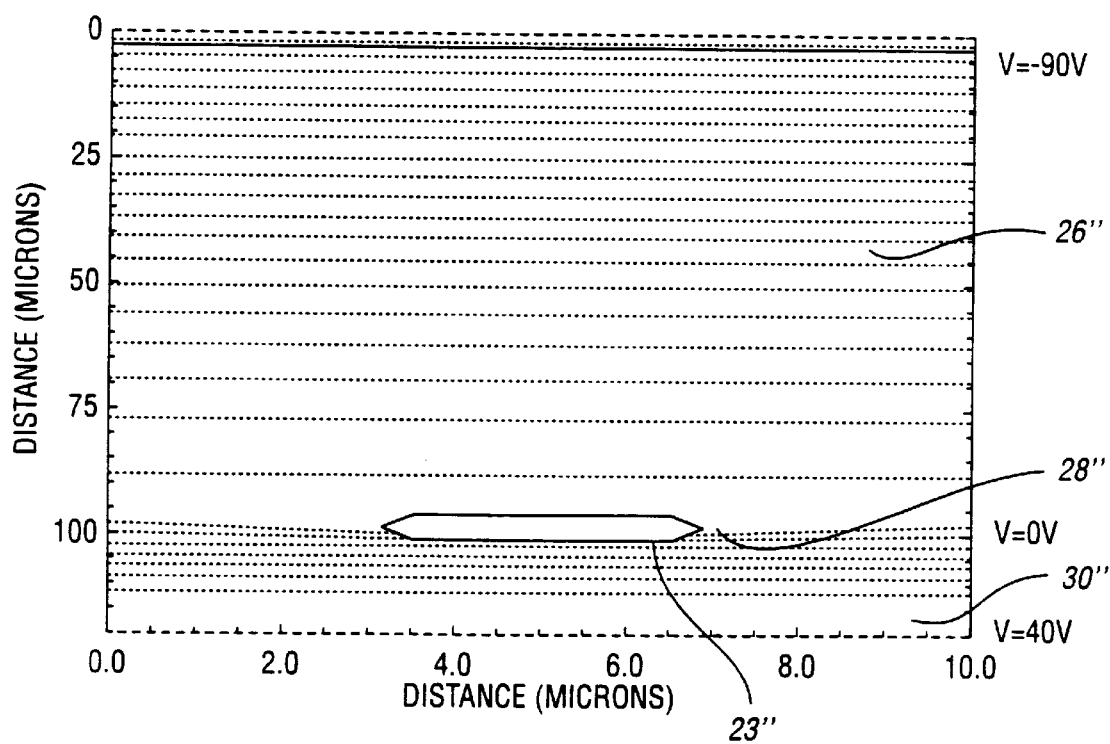
FIG. 5 is an enlarged sectional view of the part of the biased detector of FIG. 4 within dotted lines and showing contour bias lines.

FIG. 4 shows two areas enclosed with dotted lines. These areas are expanded in FIGS. 5 through 8. FIGS. 5 and 7 show numerically calculated equipotential voltage lines in the 5 regions across the SSCS 20" shown in FIGS. 3 and 4. The grid 22" is held at ground. The region 22" is held at −90 volts and the region 26" is held at 40 volts. Other voltage bias schemes may be used. FIGS. 5 and 7 show that voltage drop across the SSCS 20" is fairly constant. Only very slight deviations occur near the grid lines 22" shown in FIGS. 5 and 7. FIGS. 5 and 7 show that the voltage is well divided and that carriers will transit from the interaction region 26" into the measurement region 30". FIGS. 5 and 7 indicate that the potential drop as the carriers move through the measurement region 30" can be measured and the induced charge measured will be due to the drift of only one type of carrier (in this example the electrons).

Figure 6:
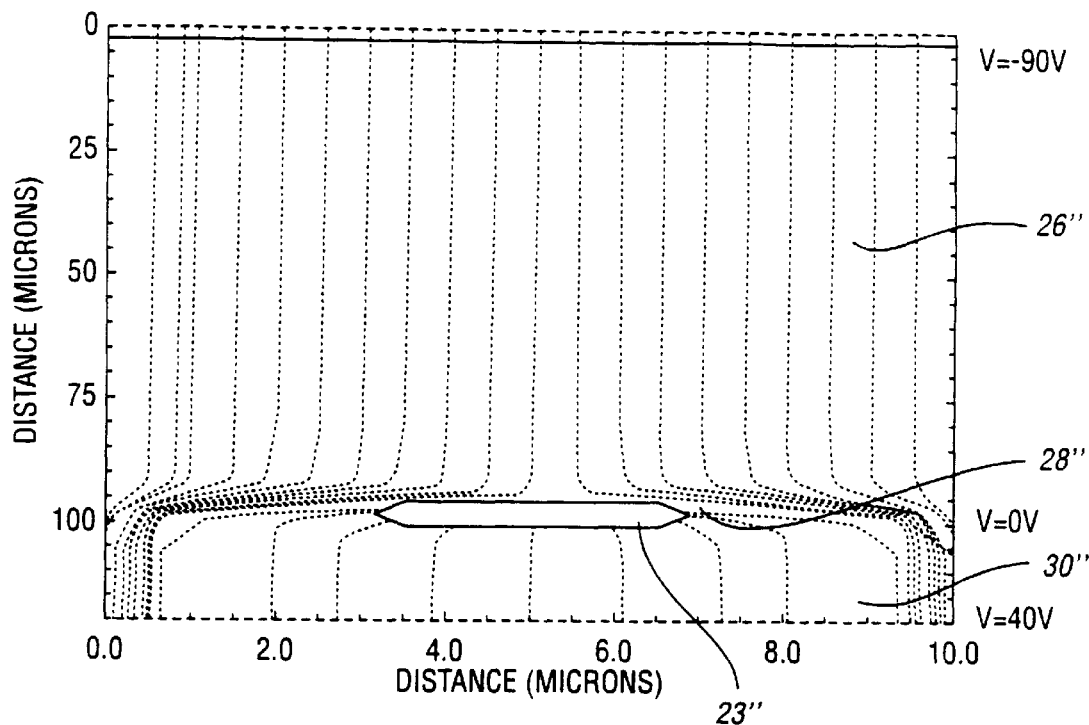
FIG. 6 is a view similar to FIG. 5 except showing electric field lines which frame the paths that a charge carrier will follow.
Figure 7:
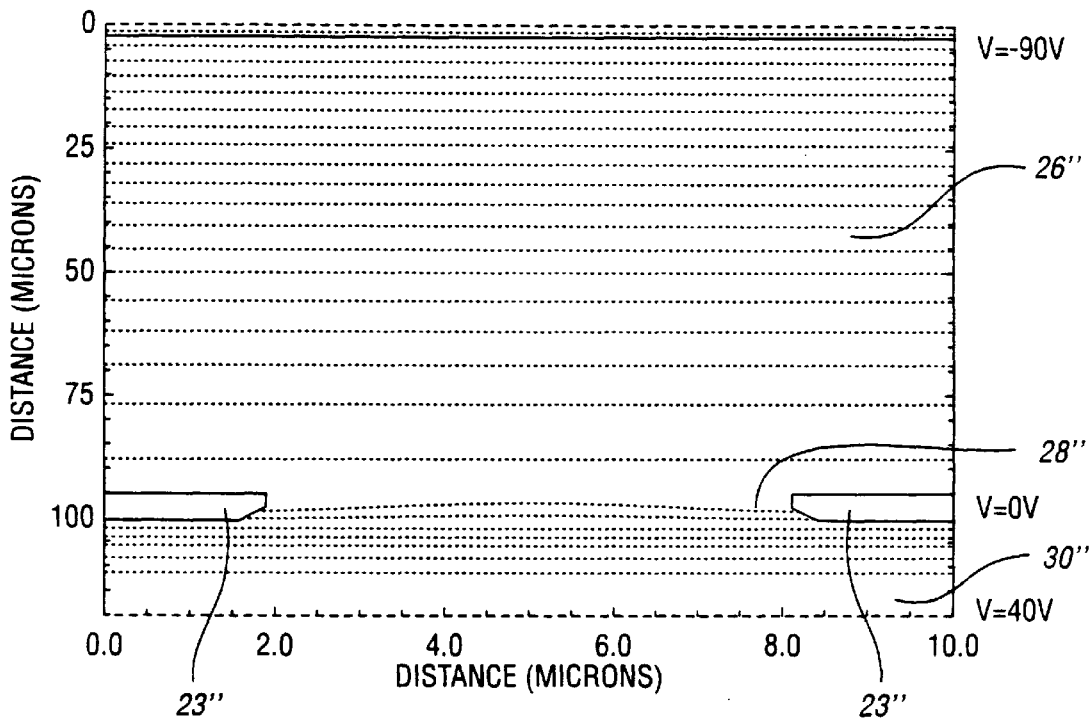
FIG. 7 is an enlarged sectional view of another part of the biased detector of FIG. 4 with other dotted lines and showing contour bias lines.
Figure 8:
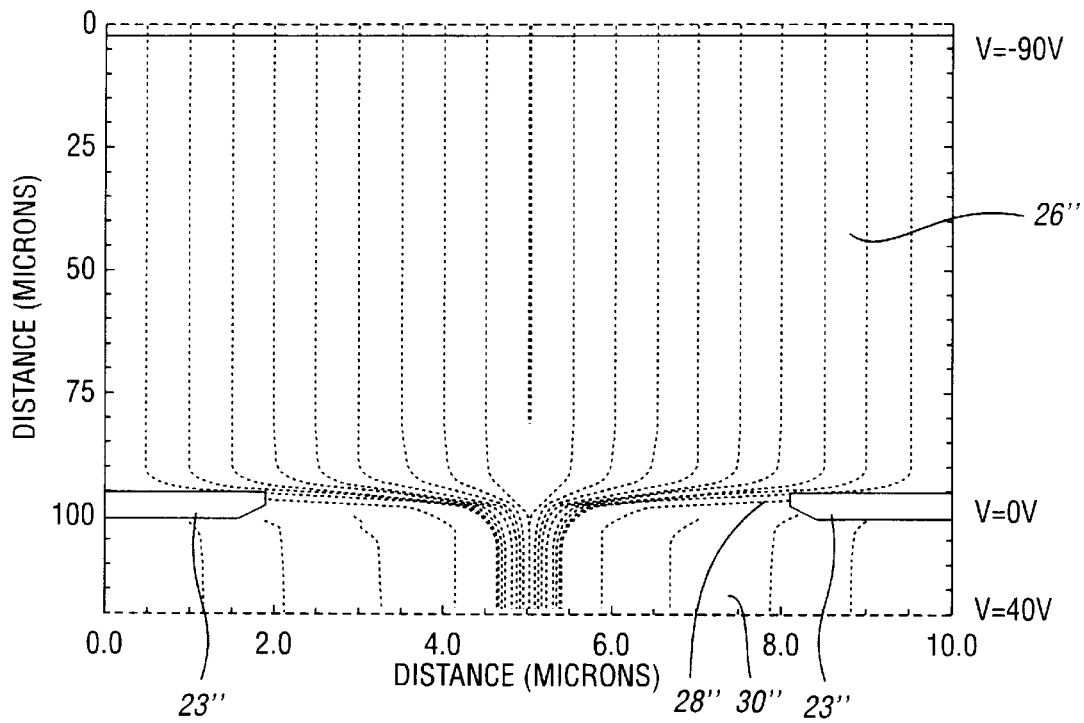
FIG. 8 is a view similar to FIG. 7 except electric field lines are shown.

FIGS. 6 and 8 show numerically calculated electric field lines for the SSCS device 20". The electric field lines go around the grid 22" and through the openings in both FIGS. 6 and 8. This clearly shows that the carriers (in this case electrons) will be directed around the grid lines 23" and into the measurement region 30". Hence, the carriers will be guided into the measurement region 30" from the interaction region 26".

Once the carriers enter the measurement region 30", the induced charge they create due to their motion through the potential in the measurement region 30" is recorded. The magnitude of the induced charge measured gives a relative measurement of the initial energy absorbed in the interaction region 26" from the original quantum or quanta of radiation.

The rectifying grid 22" divides the two regions 26" and 30" such that a reference plane exists to measure charge movement in the measurement region 30" in addition to directing electron flow.

The SSCS Device 20" Can Provide Information of the Interaction Depth

The change in pulse height can be monitored as the carriers (both electrons and holes) transit across the interaction region 26". A measurement device can be placed across the interaction region 26" and the rate of the signal rise or the rise time of the voltage pulse can be monitored. The pulse rises as the carriers transit across the interaction region 26". The rate at which the pulse rises will change as soon as one carrier enters into the measurement region 30" or as soon as one carrier type exits the device at the opposite end (FIG. 3, region 32"). The rise times and pulse shapes are functions of the location where the radiation quantum interacted and can be used to yield information where the radiation interaction occurred along the length of the interaction region 26".

The SSCS Device 20" Can Provide Information of the Interaction Location in the X-Y Coordinate Plane The pervious region 28" can be designed so that information is yielded as to where in the plane of region 28" the carriers transited. One method of implementation would be to fabricate a set of doped semiconductor lines 23" going in one direction and another set (above or below) going in a direction perpendicular to the first set. The pattern would appear to be a cross hatch of lines going in the X and Y directions. Carriers transiting through the grid 22" would go through the X-Y pattern and the location of transit can be determined with a charge-splitting resistor network.

The SSCS Device 20" As A Radiation Activated Carrier Emitter

The semiconductor single carrier spectrometer 20" can be used as a radiation activated electron emitter. The basic device 20" can be altered such that the measurement region is replaced with field emission tips. The voltage bias is held such that the tips are depleted of charge carriers. A bias voltage held external to the tips causes electrons to be emitted from the device through field emission. Hence, carriers guided into the measurement region 30" will be extracted external to the SSCS 20" by field emission. The electrons extracted can be measured in a number of different ways. For instance, the electrons might be measured with a bank of dynodes (such as in a photomultiplier tube), a microchannel plate, or a luminous or phosphor screen.

The SSCS Device 20" As A Carrier Emission Transistor

The bias scheme to the SSCS 20" can be changed such that it can be operated as a transistor. The grid region 28" serves as a gate, region 32" serves as the carrier source, and the measurement region 30" serves as the drain. If the measurement region 30" is replaced with field emitter tips, the transistor becomes a carrier emission transistor. The emission rate of the carriers is controlled by adjusting the voltage on the grid 22" and by controlling the voltage potential at the field emission tips. The potential on the field emission tips is kept such that tip material is depleted of carriers, hence the charge carriers available in the emission tips are diminished. The SSCS device 20" operated as a field emission transistor allows for its use in vacuum microelectronics.

Each of the detectors 20, 20' and 20" can be viewed as a stacked detector or array formed from a single crystal or amorphous material. The stack is a stack of individual detectors fabricated such that they are intimately grown, evaporated, deposited or any other means by which the detectors can be made to be in intimate contact through processing and fabrication. The detectors in the stack can be used together or separately.

FUNDAMENTAL THEORY OF A SEMICONDUCTOR RADIATION DETECTOR OF THE PRESENT INVENTION

Section 1. The Effects of Charge Carrier Trapping

Figure 9:
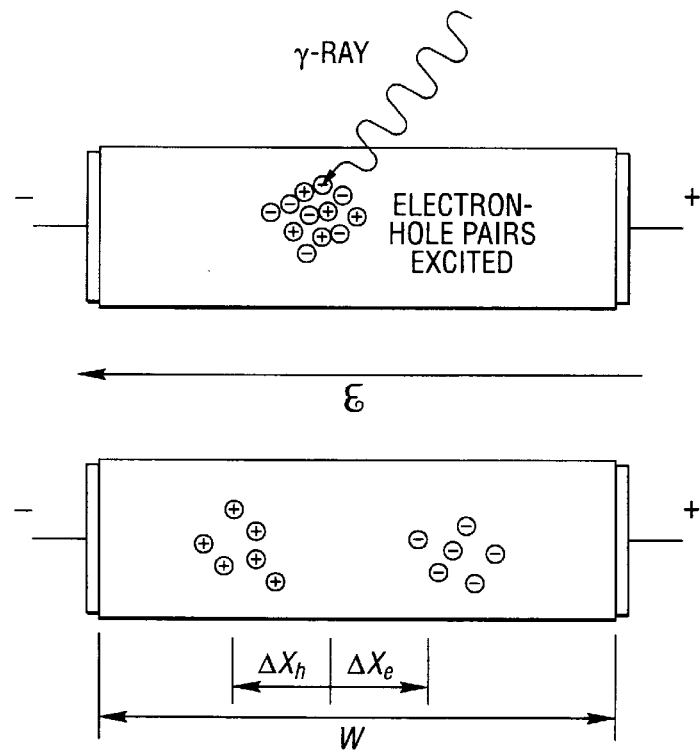
FIG. 9 is a simple depiction of a semiconductor radiation detector; a bias is placed across a block of semiconducting material; gamma rays excite electron-hole pairs, and the electrons and holes are swept apart by the electric field; the displacement of the charge carries induces a current to flow through the external circuit, which is integrated to form a voltage pulse relative in size to the total integrated current that flows as a result of the charge carrier displacement.

Referring now to FIG. 9, a simple planar semiconductor detector is operated by applying a bias voltage across the bulk of the material. Ionizing radiation excites electron-hole pairs that are drifted apart by the device electric field. Electrons are drifted toward the anode and holes are drifted toward the cathode. An induced charge is produced at the terminals of the device by the moving free charge carriers, and the induced charge can be measured by an externally connected circuit.

Shockley and Ramo derived the dependence of the induced current and induced charge produced by point charges moving between electrodes, which was later shown to apply to semiconductor detectors as well.

The Shockley-Ramo theorem shows that the induced charge appearing at the terminals of a planar device from moving point charges is proportional to the distance displaced by the moving point charges, regardless of the presence of space charge. Hence, the charge in induced charge Q* can be represented by:

$$\Delta Q^* = Q_o |\Delta x_e| + \frac{|\Delta x_h|}{W_D}, \quad (1)$$

where $Q_o$ is the initial charge excited by the interacting gamma ray, $W_D$ is the detector length, $\Delta x$ is the distance traveled by the electrons or holes, and the e and h subscripts refer to electrons or holes, respectively. With trapping, the total induced charge from a single gamma ray event in a planar semiconductor detector can be represented by:

$$Q^* = Q_o \left\{ \rho_e \left( 1 - \exp\left[ \frac{(x_i - W_D)}{\rho_e W_D} \right] \right) + \rho_h \left( 1 - \exp\left[ \frac{-x_i}{\rho_h W_D} \right] \right) \right\}, \quad (2)$$

where $x_i$ represents the interaction location in the detector as measured from the cathode and ρ is the carrier extraction factor represented by:

$$\rho_{e,h} = \frac{v_{e,h} \tau^*_{e,h}}{W_D}, \quad (3)$$

where v is the charge carrier velocity and τ* is the carrier mean free drift time. From equations 2 and 3, it becomes clear the that induced charge (Q*) will be dependent on the location of the gamma ray interaction. Small values of ρ for either holes or electrons will cause large deviations in Q* across the detector width. The induced charge deviation can be greatly reduced if a detector is designed such that the carrier with the longer mean free drift time and highest mobility contributes to all or most of the induced charge.

Equation 2 can be used to calculate the charge induction map that results from position dependent charge collection across a radiation detector. For the following example, it is assumed that all interactions are from photoelectric events. As a result, full gamma ray energy deposition is given to the photoelectron and Compton scattering is not considered. It is also assumed that the detector is uniformly irradiated and significant gamma ray attenuation does not occur.

Figure 10:
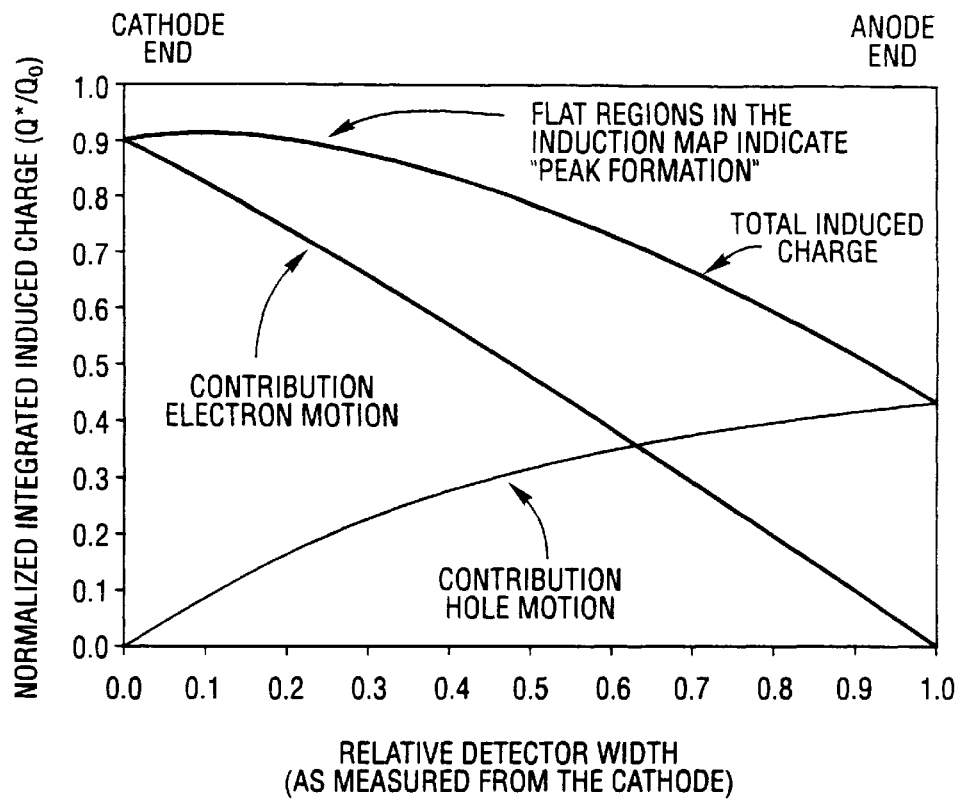
FIG. 10 is a charge induction map for a planar detector in which the hole extraction factor is 0.5 and the electron extraction factor is 5; shown is the induced charge as a function of the gamma ray interaction location; gamma ray absorption attenuation and Compton scattering are not considered; horizontally flat regions in the total induced charge on the charge induction map indicate energy peak formation in the pulse height spectrum, whereas sloped regions indicate long tail regions or continua in the pulse height spectrum; a "perfect" spectrometer would have a horizontally flat region completely across the charge induction map.

FIG. 10 shows the expected normalized induced charge for a single event occurring at any location x between the cathode and the anode of a planar detector. For the example, it is assumed that $\rho_h$=0.5 and $\rho_e$=5. Three curves are evident, one being the position dependent charge induction from hole motion, one being the position dependent charge induction from electron motion, and the total position dependent charge induction measured by the external pre-amplifier circuit.

Referring again to FIG. 10, gamma ray events that occur at the cathode (x=0) cause electron-hole pairs to appear at the cathode. The electrons are swept toward the anode, but the holes are already at the cathode, hence there is virtually no hole motion across the detector. It is the displacement of charge in the detector that creates the induced charge signal, not the collection at an electrode. As a result, the measured signal is due to electron motion across the device. The effect of charge carrier losses from trapping prevents the measured charge from being 100% of the initially excited charge. However, with an electron carrier extraction factor of 5, the measured induced charge is 92% of the initially excited charge.

For gamma ray events that occur at the anode, only the holes contribute to the induced charge as they move across the detector toward the cathode. The low hole extraction factor of 0.5 indicates severe trapping, in which case the total measured induced charge is only 43% of the initial excited charge. As a result, the signal measured for gamma ray events near the cathode will be over twice the magnitude of signals measured from gamma ray events that occur near the anode. Hence, the measured induced charge is position dependent upon where the gamma ray event occurs.

Figure 11:
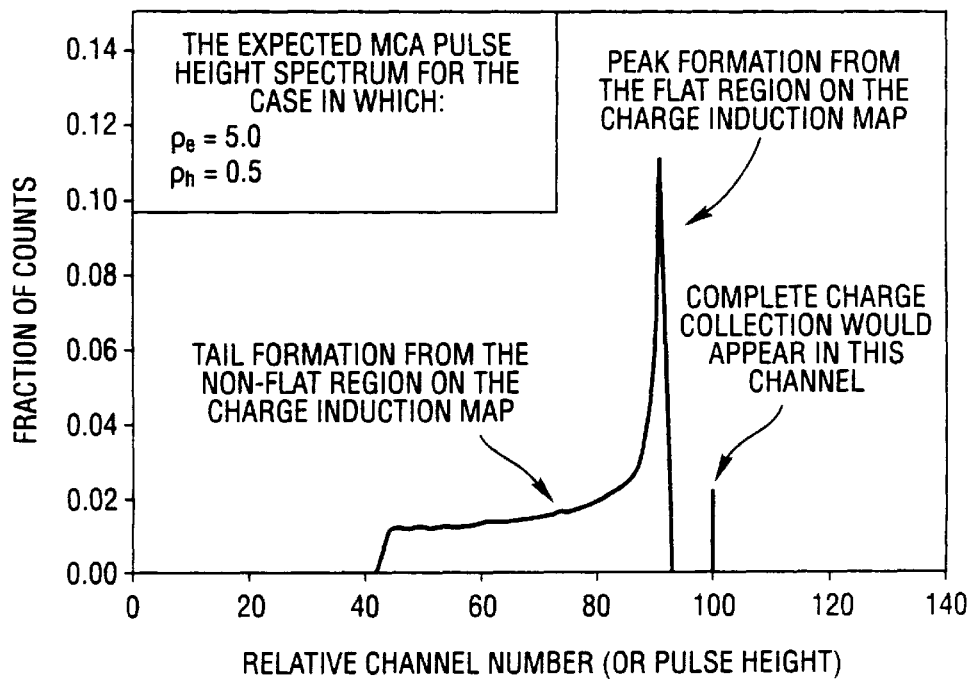
FIG. 11 is an expected pulse height spectrum from a planar detector with the characteristic charge induction map of FIG. 10; Compton scattering and gamma ray attenuation are neglected in the simulation; the "full energy peak" appears at a channel lower than expected for full charge collection due to electron and hole trapping; the tail appears as a consequence of position dependent charge collection.

Regions that appear horizontally flat on the total induced charge curve indicate a region in which the position-dependent charge collection deviates only slightly. As a result, a "peak" will appear in the multi-channel analyzer (MCA) pulse height spectrum (see FIG. 11). Regions that are not horizontally flat will appear as "tail regions" in the MCA pulse height spectrum. From FIG. 10, it becomes clear that both electrons and holes must be collected with high efficiency in order to reduce or eliminate position-dependent charge collection effects that cause resolution degradation in planar type semiconductor radiation spectrometers. One method that has been shown to reduce position dependent charge collection problems with gas based ion chamber radiation detectors is the implementation of the Frisch grid.

Section 2. The Fundamental Frisch Grid Concept

A similar situation to that explained for the semiconductor detector is experienced with gas filled ion chambers, in which electron-ion pairs are produced by gamma ray interactions in the gas. The electron mobilities are much higher than the positive ion mobilities, hence the extraction times of the electrons are considerably less than the extraction times of the ions. For typically used integration times, the measured pulse amplitude becomes dependent on the initial gamma ray interaction location in the ion chamber. As a result, wide variations in pulse amplitude are possible.

Figure 12A:
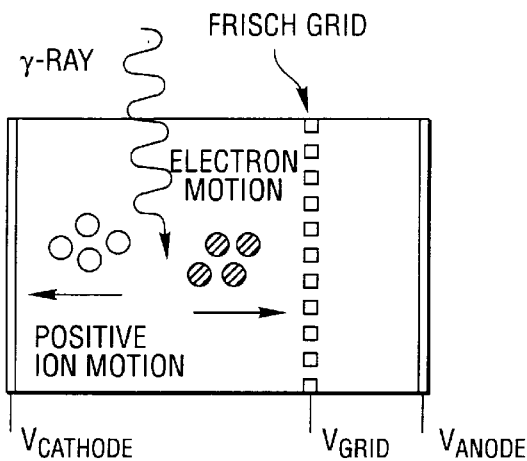
FIG. 12a shows the basic configuration for a Frisch grid gas detector; the gas detector volume is separated into an interaction region and a measurement region; electron charge carriers are drifted toward the anode by an applied bias.
Figure 12B:
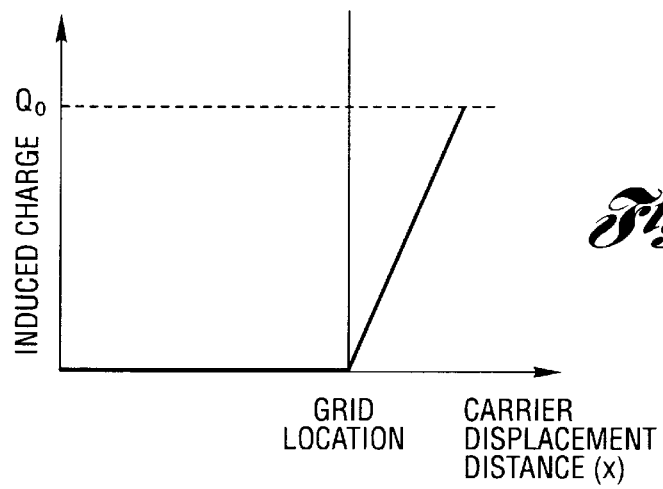
FIG. 12b shows the induced charge that appears at the anode is zero until the electrons pass through the grid; after passing through the grid, a charge is induced proportional to the distance traveled by the charge carriers between the grid and the anode.

A Frisch grid gas ion chamber is designed to measure the induced charge primarily from electrons, and the general configuration and operation of a Frisch grid ion chamber is shown in FIG. 12a. The technique involves separating the radiation detector into two regions by a screen or grid. One region is large and is where the majority of gamma ray interactions occur in the device. A gamma ray interaction occurring in the main volume of the detector excites electron-ion pairs.

An externally applied electric field drifts the excited charge carriers in opposite directions, in which the electrons drift through the grid and into the measurement region of the device. The positive ions drift the opposite direction and do not enter into the smaller measurement region of the device. From the Shockley-Ramo theorem, the induced charge produced at the anode results from charge carriers moving between the conductive grid and the anode and not from charge motion between the cathode and the grid. As a result, the detector is primarily sensitive to only the electron charge carriers. Usually, the measurement region is well shielded such that relatively few gamma ray interactions occur in the measurement region, hence almost all of the measured induced charge is from electrons that have been swept into the measurement region from the interaction region.

The semiconductor counterpart of the gas ion chamber Frisch grid detector would operate similarly with these noted differences:

1. The semiconductor Frisch grid would be used to compensate for the effects of trapped hole (or electron) charge carriers, not just for slow rise times from poor charge carrier mobilities.
2. The semiconductor Frisch grid detector actually has three regions (not two), those being (a) the interaction region, (b) the pervious region, and (c) the measurement region.
3. The semiconductor Frisch grid detector will still suffer from electron (or hole) charge loss due to trapping in the interaction, pervious and measurement regions.
4. The semiconductor Frisch grid detector will most likely be smaller than the Frisch grid ion chamber, hence shielding the measurement region is difficult. As a result, gamma ray interactions will occur in all three regions, and some of the induced charge in the measurement region will be from hole motion originating in the measurement region.

The interaction region is typically the largest volume of the device, and most of the gamma ray interactions occur in the interaction region simply because it composes the largest percentage of the detector volume. The pervious region is the location where the Frisch grid is located. It should be composed of the same material as the detector, or at least a material that allows for electrons to freely move through it into the measurement region. The most straightforward method of producing such a region is to have it be composed of the very same material as the interaction and measurement regions of the device.

The grid structure can be implemented by many different ways, including but not limited to outside contacts, outside and buried p or n doped regions, and grooved metallized regions.

Section 3. The Planar Parallel Strip Frisch Grid Radiation Detector

Figure 13:
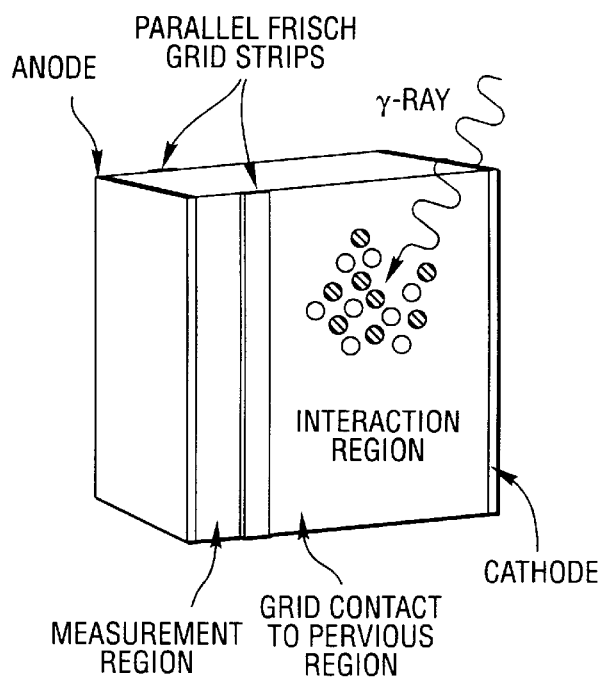
FIG. 13 shows the basic configuration for a parallel strip semiconductor Frisch grid radiation detector.

The most straightforward and obvious method to produce a simple semiconductor Frisch detector is by placing parallel contacts on a slab of semiconducting material or a concentric contact ring around a slab of semiconducting material. There are problems with this approach (which will be discussed), yet implementation of the concept serves to demonstrate the principle. A conceptual drawing of the device is shown in FIG. 13.

The device, as previously discussed, has three major sections: those being the interaction region, the pervious region and the measurement region. The parallel grid of FIG. 13 is in direct contact with the pervious region, and the pervious region is composed of the same material as the interaction region and the measurement region.

The different regions and their designations are again shown in FIGS. 14a and 14b. A gamma ray event occurring in the interaction region will excite electron-hole pairs. Electrons are swept from the interaction region toward the parallel grid, however some trapping will occur as the electrons drift across the interaction region and the measurement region. Including the effect of trapping, the measured induced charge from electrons excited in the interaction region by a gamma ray event at a distance $x_i$ from the cathode will be:

$$Q^* = K(x, y) Q_o \rho_{em} \left(1 - \exp\left[\frac{-1}{\rho_{em}}\right]\right) \exp\left[\frac{x_i - \frac{W_p}{2} - W_i}{v_e \tau_e^*}\right], \quad (4)$$

where $K(x,y)$ is a correction factor for deviations in the weighting potential across the device and $$\rho_{em,hm} = \frac{v_{e,h} \tau_{e,h}^*}{\left(\frac{W_p}{2} + W_m\right)}, \quad (5)$$

where the symbols are shown in FIG. 14a. It is assumed that the induced charge on the anode begins to increase primarily as the electrons transit across the middle of the pervious region as illustrated in FIG. 14b. For gamma ray interactions that occur directly in the measurement region, the induced charge will now be dependent on both electron and hole motion with the measurement region. Including the effects of electron and hole trapping, the induced charge from gamma ray events occurring in the measurement region is:

$$Q^* = Q_o K(x, y) \rho_{em} \left(1 - \exp\left[\frac{(x_i - W_D)}{\rho_{em}\left(\frac{W_p}{2} + W_m\right)}\right]\right) + \\ Q_o K(x, y) \rho_{hm} \left(1 - \exp\left[\frac{\left(W_D - x_i - W_m - \frac{W_p}{2}\right)}{\rho_{hm}\left(\frac{W_p}{2} + W_m\right)}\right]\right). \quad (6)$$

The "weighting potential" concept is often used to determine the dependence of the observed (or measured) induced charge on the geometry and electrode configuration of a detector. In a given environment in which N number of electrodes in a space are connected to ground the general expression derived by Shockley for the current induced on an electrode by a moving point charge is:

$$I_{N=1} = \frac{dq_1}{dt} = -\nabla V_1(r) \cdot \frac{dr}{dt} = E_1(r) \cdot v \quad (7)$$

where $E_1(r)$ is the electric field at point r due to a unit potential on conductor 1 with all others (2 . . . N) grounded (set at 0), v is the carrier velocity, and $V_1$ is the potential at conductor 1. The solution to the gradient of $V_i(r)$ with the potential at electrode N=i held at unity (unit=1.0) and all other conductors held at 0 is the normalized potential distribution or weighting potential for charge induction on contact N=i. The change in the weighting potential over Δx is equivalent to the change in normalized induced charge ($\Delta Q^*/Q_o$) for charge carriers moving through the same distance Δx.

Figure 15B:
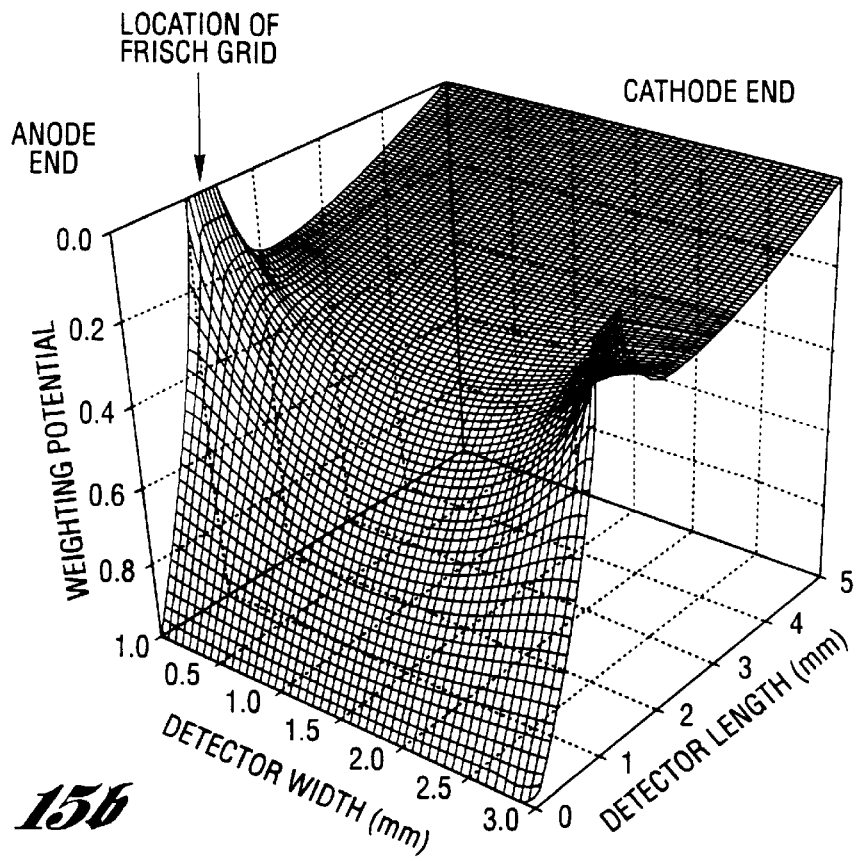
Figure 15C:
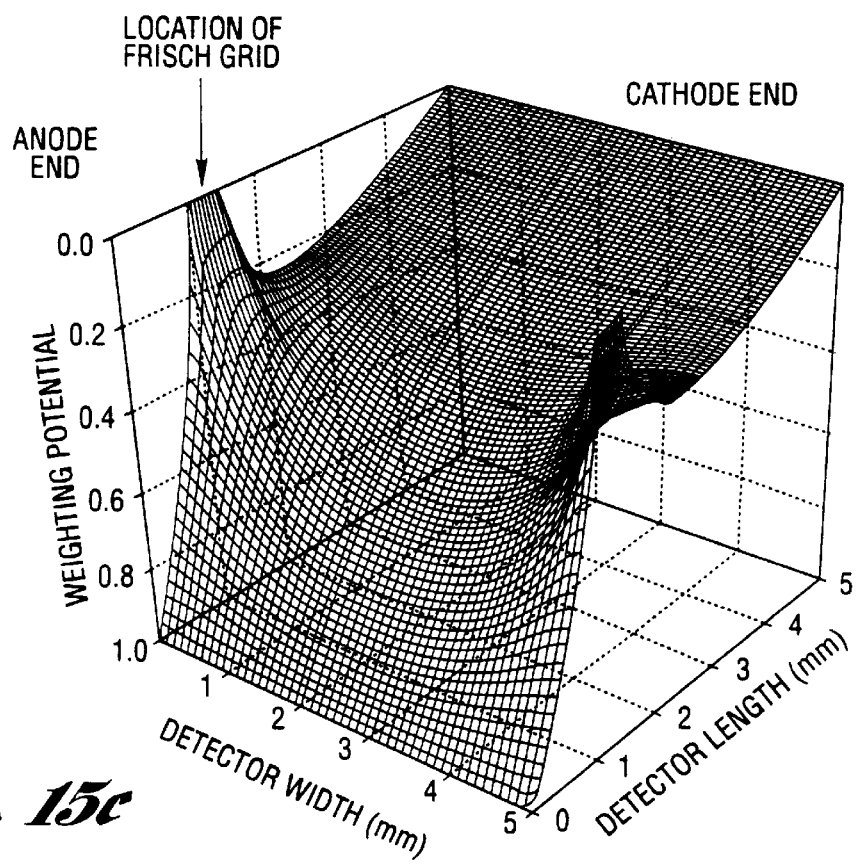

The weighting potential of the device is greatly influenced by the length-to-width ratio, and not just the device width. FIG. 15a shows the calculated weighting potential of 5 mm×2 mm×5 mm device, FIG. 15b shows the calculated weighting potential of a 5 mm×3 mm×5 mm device, and FIG. 15c shows the weighting potential of a 5 mm×5 mm×5 mm device. As is clearly shown, deviations increase across the weighting potential as the detector width is increased.

Figure 16A:
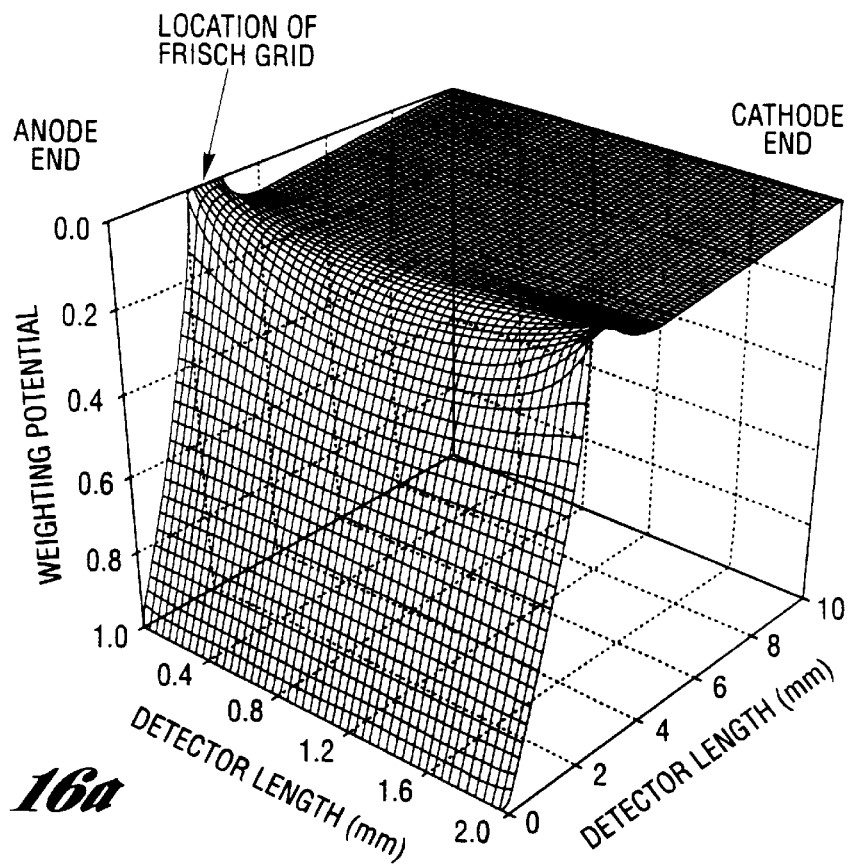
Figure 16B:
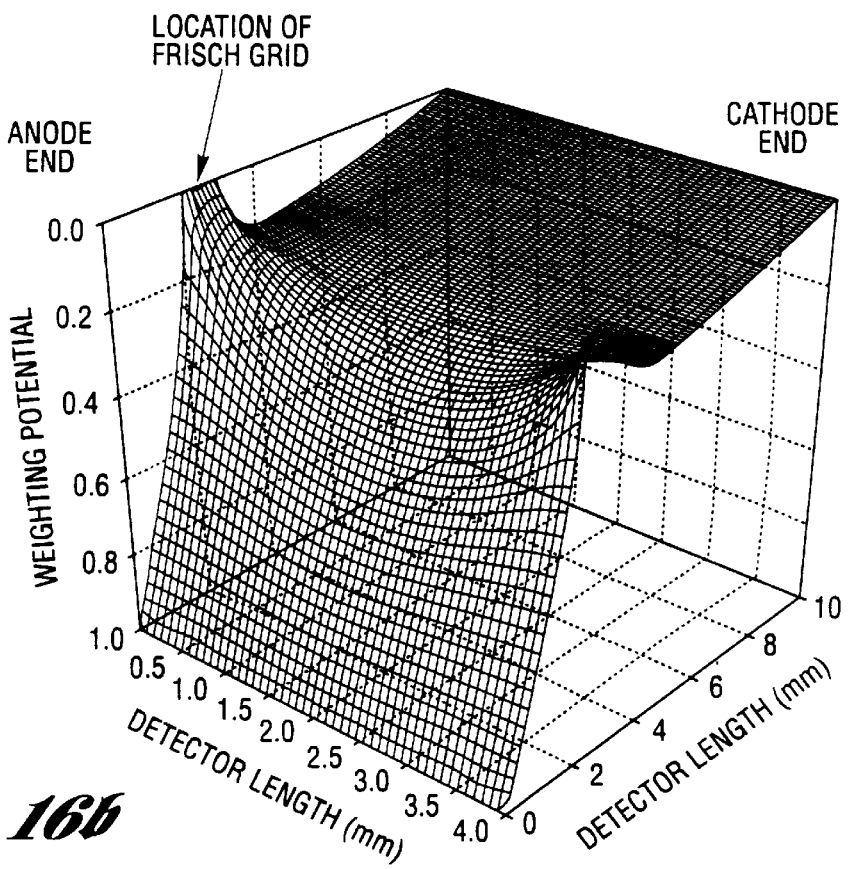
Figure 16C:
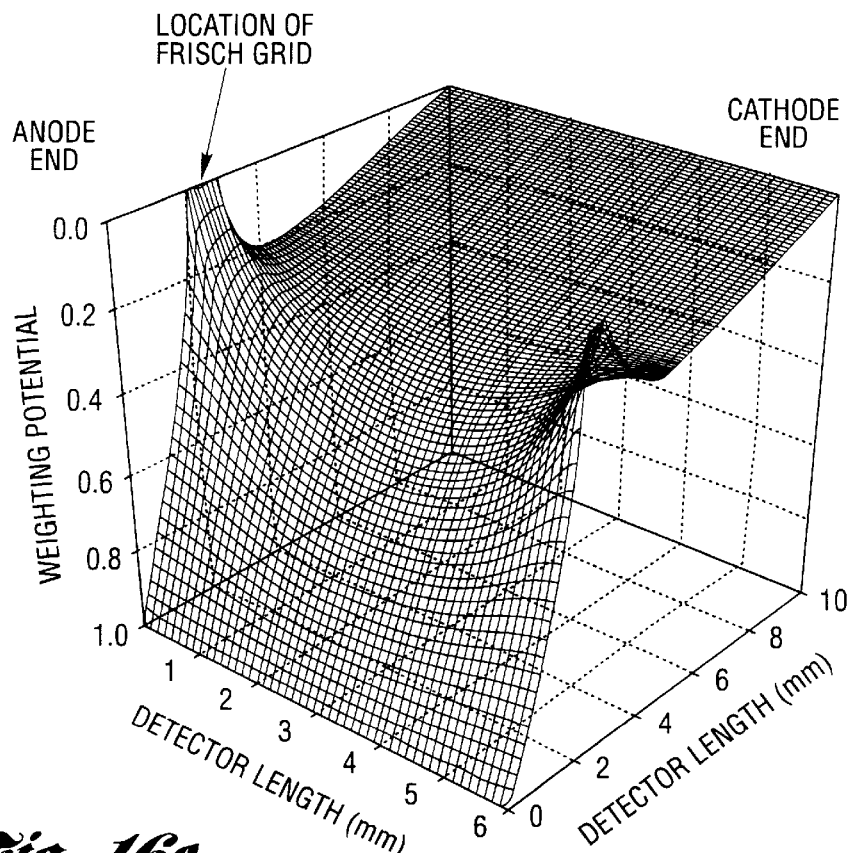

FIG. 16a shows the weighting potential across a 10 mm×2 mm×10 mm device; FIG. 16b shows the calculated weighting potential of a 10 mm×4 mm×10 mm device; and FIG. 16c shows the weighting potential of a 10 mm×6 mm×10 mm device. Notice that deviations in the weighting potential for the 10 mm×2 mm×10 mm device are much less than that of the 5 mm×2 mm×5 mm device, which was observed experimentally. Also, the weighting potential of the 5 mm×2 mm×5 mm device is identical to the 10 mm×4 mm×10 mm device, indicating that under conditions of similar electric field strengths, the two devices should perform similarly (excluding differences in electron charge carrier trapping effects). Again, the larger 10 mm×6 mm×10 mm device clearly has a less distorted weighting potential than the smaller 5 mm×5 mm×5 mm device. Hence, it becomes readily apparent that the length to width ratio determines the expected spectroscopic performance of the device (at least in part).

It should be stated that in the ideal case there would be no change in the induced charge or weighting potential in the interaction region, but a distinct change in induced charge would appear (from 0 to 1) only as the electrons transited the measurement region. Due to the imperfect screening in a semiconductor type Frisch grid, some charge induction occurs as carriers move through the interaction region (as shown in FIGS. 15a through 15c and 16a through 16c).

Two CdZnTe parallel strip Frisch grid detectors generally of the type shown in FIG. 13 were designed and tested. Detector 1 had dimensions of 5 mm×2 mm×5 mm (weighting potential of FIG. 15a). The parallel strips were 0.5 mm wide and were fabricated onto the 5 mm×5 mm faces at a distance of 1 mm back from the anode.

Detector 2 had dimensions of 10 mm×2 mm×10 mm (weighting potential of FIG. 16a). The parallel strips were 1 mm wide and were fabricated onto the 10 mm×10 mm faces at a distance of 2 mm back from the anode.

Detector 1 (5 mm×2 mm×5 mm) was operated with the anode grounded and the cathode held at −400 volts. Operating voltages above 400 volts caused unacceptably high surface leakage currents. The detector was tested with both the parallel Frisch grid "off" (floating) and biased at −80 volts. The device was uniformly irradiated from the side by 662 keV gamma rays from a calibrated 137Cs source.

Figure 17:
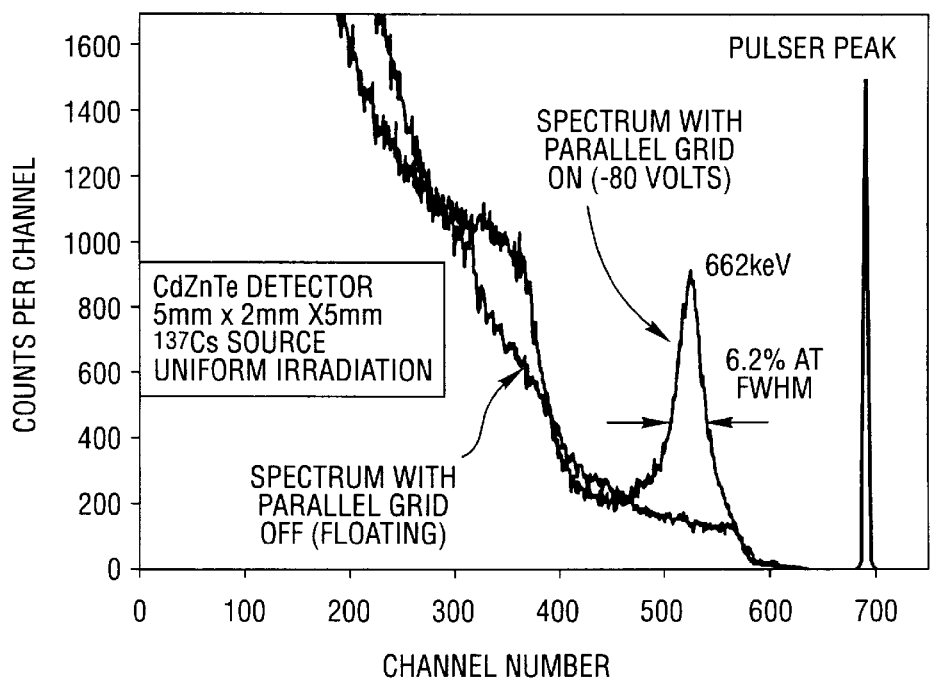
FIG. 17 shows room temperature spectra of 662 keV gamma rays from the 5 mm×2 mm×5 mm CdZnTe semiconductor parallel strip Frisch grid detector with the grid "off" (floating) and "on" (−80 volts)

FIG. 17 shows room temperature spectra from the device with the grid "off" and "on". With the grid "off", no discernable full energy peak is apparent. However, a gamma ray peak becomes clearly obvious when the parallel grid is "on". The measured energy resolution of the 662 keV peak is 6.2% at FWHM.

To demonstrate that the parallel strip Frisch grid was functioning properly, a 2 cm thick lead attenuator was placed between the 137Cs gamma ray source and the detector such that gamma rays entered only into the interaction region of the device. As a result, all pulses observed from the detector under test were from charge carrier motion originating from the interaction region of the detector.

Figure 18:
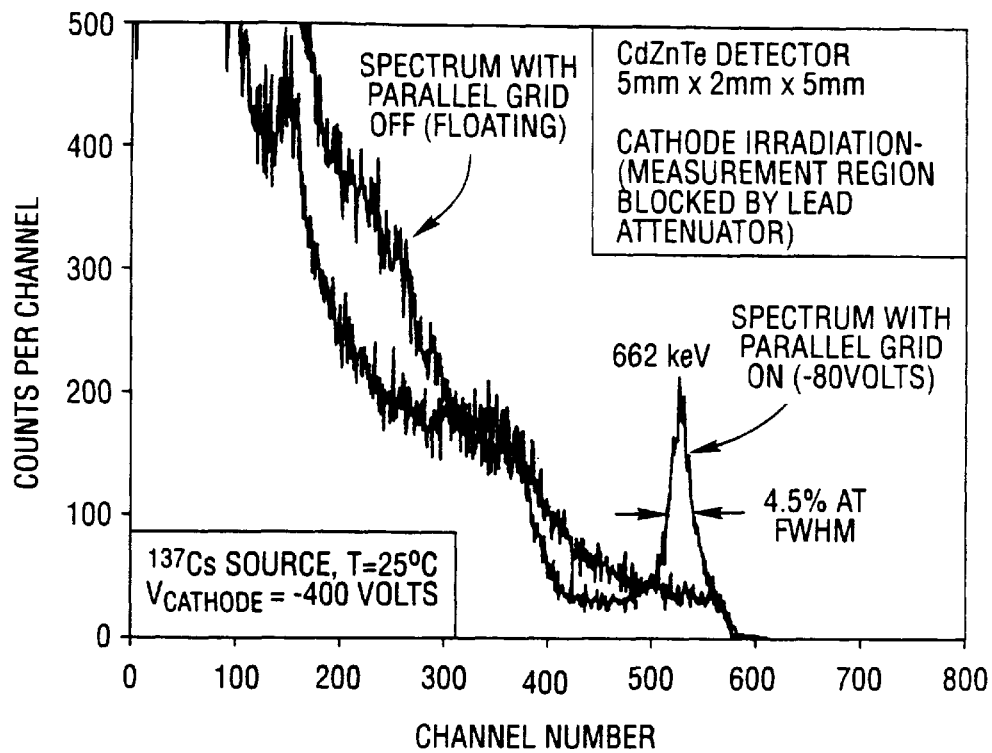
FIG. 18 shows room temperature spectra of 662 keV gamma rays from the 5 mm×2 mm×5 mm CdZnTe semiconductor parallel strip Frisch grid detector with the grid "off" (floating) and "on" (−80 volts); the detector has been shielded with a lead attenuator such that gamma rays interacted only in the interaction region.

Shown in FIG. 18 are spectra taken with the parallel strip Frisch grid "off" (floating) and turned "on" (−80 volts). No full energy peak is apparent when the parallel grid was "off", however a full energy peak with 4.5% energy resolution at FWHM becomes obvious when the grid was "on". It is clear that the device was operating as a true single carrier sensitive semiconductor Frisch grid detector.

Detector 2 (10 mm×2 mm×10 mm) was operated with the anode grounded, the cathode biased at −400 volts, and the parallel grid either "off" (floating) or "on" (−70 volts). Again, severe surface leakage currents prevented the application of operating voltages above 400 volts across the detector bulk.

Figure 19:
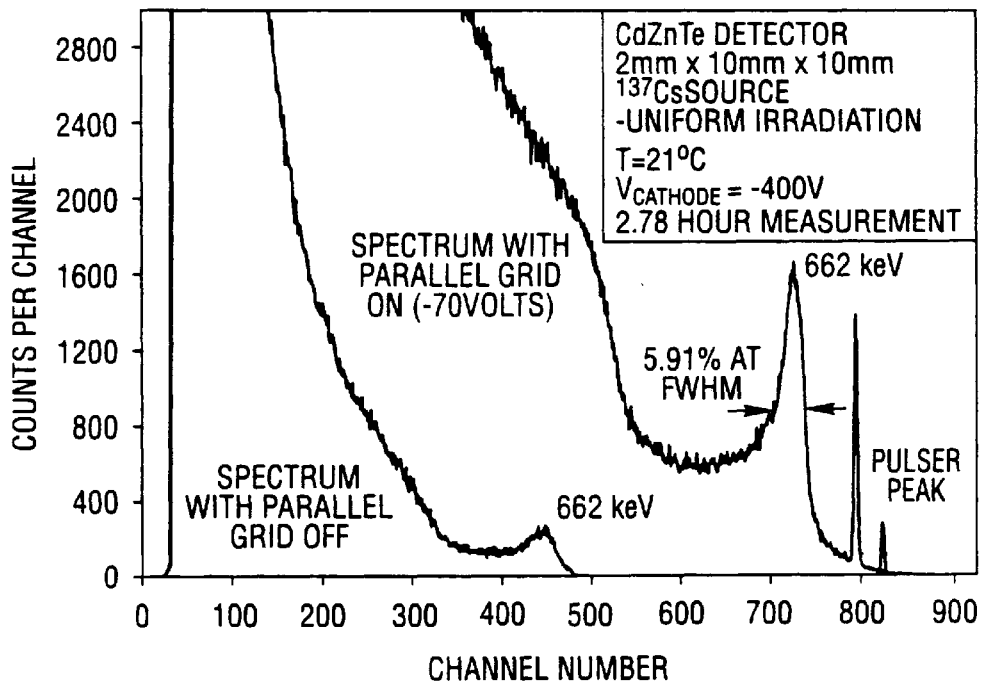
FIG. 19 room temperature spectra of 662 keV gamma rays from the 10 mm×2 mm×10 mm CdZnTe semiconductor parallel strip Frisch grid detector with the grid "off" (floating) and "on" (−70 volts)

FIG. 19 shows room temperature spectra taken with the 10 mm×2 mm×10 mm CdZnTe parallel strip Frisch grid semiconductor spectrometer with the grid "off" and "on". With the grid "off", a barely discernable full energy peak is apparent. With the grid "on", the 662 keV peak becomes obvious, with a measured energy resolution of 5.91% at FWHM.

As indicated from the calculated weighting potentials in FIGS. 15a–c and 16a–c, the induced charge deviation across the interaction region of the 10 mm×2 mm×10 mm device should be less than that of the 5 mm×2 mm×5 mm device, which may explain why the resolution is better for the larger detector. The weighting potentials for the devices are different primarily because the width-to-length ratio is smaller for the 10 mm×2 mm×10 mm detector from the 5 mm×2 mm×5 mm detector. As a result, the parallel grids help to flatten the weighting potential in the interaction region more so for the larger detector than the smaller detector. The result indicates that a thicker device (10 mm×4 mm×10 mm) would have similar performance as the 5 mm×2 mm×5 mm device.

Also apparent is the fact that the pulse height dramatically increased when the grid was turned "on". This observation can be explained as a consequence of the difference in the method by which the induced charge is formed on the anode. When operated with the grid floating, the detector performs as a simple planar detector with 1 cm of material between the anode and the cathode. Equation 2 describes the expected induced charge as a function of the gamma ray interaction depth. Since the carrier extraction factors are much higher for electrons than holes, the largest induced charge pulse will appear from electrons that are excited near the cathode. The low bias voltage of −400 volts produces a relatively low electric field across the device, hence the electron velocity is relatively low, and the electrons will undergo some appreciable trapping before reaching the anode. The resulting maximum pulse height measured by the external circuit is relatively low.

When the grid is activated, the largest induced charge pulse is generated by electrons excited in the middle of the pervious region. These electrons have undergone no appreciable trapping before entering the measurement region, and the resulting pulse height corresponding to the induced charge will be much higher (as observed). The observed spectra from the CdZnTe detector with the grid "off" and "on" further demonstrates that the detector is operating as a true semiconductor Frisch grid device.

The interactions that occur in the measurement region act more to contaminate the spectrum rather than enhance the resolution. The effect is clearly shown in FIGS. 17 and 18, in which the resolution and peak to valley ratio improved when the gamma ray interactions were significantly reduced from interacting in the measurement region. Hence, the ratio of the interaction region volume to that of the entire volume should be as large as possible. Such a ratio can be approximated by $$F_i \approx \frac{W_i + \frac{W_p}{2}}{W_D} = \frac{2W_i + W_p}{2(W_i + W_p + W_m)}. \tag{8}$$

Unfortunately, the overall result is that the parallel strip Frisch grid detector is doomed to be relatively thin, with the best prototype devices tested to date having a length to width ratio of 5. A stacked series of devices can also be fabricated, yet the case is non-ideal in that the Compton scatter losses can be significant, and numerous devices must be used to fabricate a useful system. Coupling noise will ultimately reduce the number of detectors that can be linked together while still maintaining reasonably high gamma ray energy resolution. Hence, a system of stacked (or coupled) planar parallel strip Frisch grid radiation detectors can also be limited in size. A new design can overcome many of these problems, that being the "Geometrically Weighted Semiconductor Frisch Grid Radiation Spectrometer".

Section 4. The Geometrically Weighted Frisch Grid Radiation Detector

As previously discussed in Section 3, the planar parallel strip semiconductor Frisch grid detectors show promise as room temperature operated gamma ray spectrometers. However, they have fundamental problems which include:

a. The interaction region to measurement region ratio ($W_i/W_m$) is small, which results in significant spectrum contamination from gamma ray interactions in the measurement region.
b. The device must remain thin in order to maintain a good length to width ratio, thereby preserving good screening of induced charge from hole transport.
c. The device is too small to efficiently recapture Compton scattered gamma rays. As a result, it is only good for measuring low energy gamma rays. If the device is fabricated wider to increase the gamma ray interaction efficiency, then the weighting potential distribution deviates largely across the device, which causes resolution degradation. Stacking the devices offers a solution to increase the efficiency, but coupling noise between the devices ultimately limits gamma ray energy resolution.

The solution is to fabricate a detector with the Frisch grid end very small and the interaction region very large. Hence, induced charge from hole motion remains well screened while increasing the size of a single device. The scheme allows for large detectors to be manufactured with increased gamma ray interaction efficiency while maintaining good Frisch grid screening. Additionally, the $W_i/W_m$ ratio will increase as a natural consequence of the design, thereby significantly reducing spectrum contamination from gamma ray interactions in the measurement region.

Figure 20A:
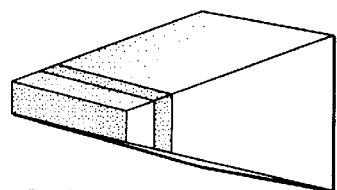
FIGS. 20a, 20b, and 20c are three possible designs for a geometrically weighted semiconductor Frisch grid radiation spectrometer; shown are (a) a trapezoidal design, (b) a pyramid frustum, and (c) a conical frustum, respectively.
Figure 20B:
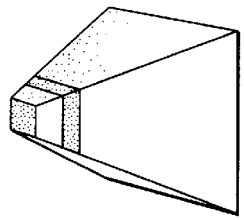
Figure 20C:
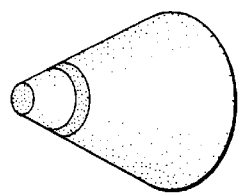

FIGS. 20a–c shows three possible designs of the geometrically weighted semiconductor Frisch grid radiation detector. The designs incorporate three major effects to improve gamma ray energy resolution, those being (a) the geometric weighting effect, (b) the small pixel effect, and (c) the Frisch grid effect.

The Geometric Weighting Effect

For simplicity, it is first assumed that gamma ray interactions occur uniformly throughout the detecting volume. It is also assumed that only photoelectric absorption is taking place within the detector (no Compton scattering and no pair production). Hence, the gamma ray interaction rate is uniform and constant for any unit volume dxdydz within the detector. No doubt that this case is unrealistic, yet it will serve to help clarify the advantage of the geometric weighting effect.

Figure 21:
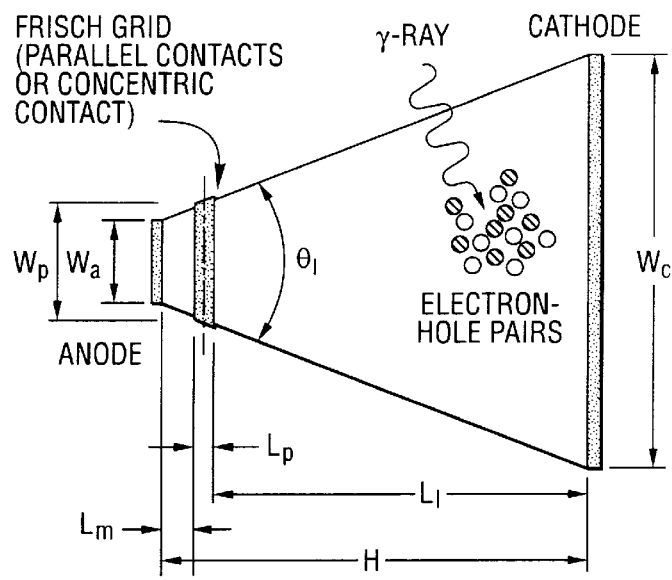
FIG. 21 is a diagram of the general features for a geometrically weighted semiconductor Frisch grid radiation detector.

FIG. 21 shows a hypothetical trapezoidal (truncated prism) detector with the following notations: the cathode width=$W_c$, the anode width=$W_a$, the width in the center of the pervious region=$W_p$, the interaction region height=$L_i$, the pervious region height=$L_p$, the measurement region height $L_m$, and overall detector height=H and the detector length=D. The overall volume of the device is described by:

$$V = DH\left(\frac{W_a + W_c}{2}\right). \tag{9}$$

The fraction of gamma ray interactions occurring in the interaction region is approximated by:

$$F_i \approx \frac{\left(\frac{W_c + W_p}{2}\right)\left(L_i + \frac{L_p}{2}\right)}{\left(\frac{W_a + W_c}{2}\right)(L_i + L_p + L_m)} \tag{10}$$
$$= \frac{(W_c + W_p)(2L_i + L_p)}{2(W_a + W_c)(L_i + L_p + L_m)},$$

which can be shown to reduce to parallelepiped case (planar case) by making $W_a=W_c=W_p$. For the following examples, a restraint of $W_a=2$ mm is imposed in all cases. With $W_c=10$ mm, D=10 mm, H=10 mm, θ=43.5° and with the Frisch grid=1 mm wide centered 2.0 mm back from the anode, the fraction of events occurring in the interaction region can be shown to be 85.3%. From equation 8, a 2 mm thick parallelepiped that is 10 mm long and 10 mm wide with a 1 mm wide Frisch grid centered 2 mm back from the anode has $F_i$=80%. Hence, the fraction of interactions occurring in the interaction region is increased for the trapezoidal case over the parallelepiped case. Furthermore, the volume of the parallelepiped design is 200 mm³, whereas the volume of the trapezoid design would be 600 mm³. The overall result is a 3.2 times increase in detector gamma ray sensitivity in the interaction region for the trapezoidal design, while retaining a higher rejection ratio for gamma ray interactions occurring in the measurement region.

Hence, the geometric shape of the trapezoidal detector design allows for a higher ratio of gamma ray interactions to occur in the interaction region over the measurement region than that observed for a parallelepiped parallel strip Frisch grid detector. The general trend for $F_i$ is to approach unity for both designs until the Frisch grid ultimately contacts the anode, yet the volume of the trapezoid design remains much larger than the parallelepiped design, thereby being more efficient as a gamma ray sensor.

The gamma ray probability distribution function is highest near the cathode and lowest near the anode for a trapezoidal shaped semiconductor Frisch grid detector. In the present example (uniform irradiation), the normalized total gamma ray probability distribution function for a trapezoidal device is:

$$P_N(x)dx = \frac{2x\tan\left(\frac{\theta_1}{2}\right) + W_a}{H^2\tan\left(\frac{\theta_1}{2}\right) + HW_a} dx, \; 0 \leq x \leq H, \quad (11)$$

where x refers to the distance from the anode toward the cathode and $\theta_1$ refers to the acute angle at the anode (see FIG. 21). As a result, the probability of electron dominated induced charge motion is much higher than hole dominated induced charge motion for simple geometric reasons.

Returning to the previous example with $\theta_1=43.5°$, H=10 mm and $W_a=2$ mm, consider the number of gamma ray interactions that occur within 1 mm of the cathode. Integrating equation 11 from x=9 mm to x=10 mm yields a normalized interaction probability of 16.07%, whereas integrating from x=0 mm to x=1 mm yields a normalized gamma ray interaction probability of 3.93%. Hence, over four times as many events occur within 1 mm of the cathode than within 1 mm of the anode, which serves to demonstrate that the accumulated gamma ray pulse height spectrum will be formed primarily from electron dominated induced charge pulses.

The Small Pixel Effect

The "small pixel" effect is the unique weighting potential and induced charge dependence observed with devices having non-symmetrically sized electrodes. The signal formation from a basic planar type of semiconductor detector was discussed earlier, in which it was found that the induced charge has a linear relationship between the distance a carrier travels and the observed increase in induced charge (see equation 1). Such a relationship is not true when the contacts of a device are not the same size.

In the case that a detector has a small anode and a large cathode, the weighting potential changes much more abruptly near the anode than the region near the cathode. As a result, more charge is induced as charge carriers move in the vicinity of the small anode than charge carriers moving in vicinity near the cathode. As a result, more charge is induced as charge carriers move in the vicinity of the small anode than charge carriers moving in vicinity near the cathode. From the natural effect of geometrical weighting, more charge carrier pairs are produced near the cathode over that of the anode.

As a result, more electrons will be drifted towards the small anode over the number of holes "born" at the anode. The result is that the induced charge influenced by the electron carriers becomes even greater when the small pixel effect is coupled to the geometrically weighted effect.

Figure 22:
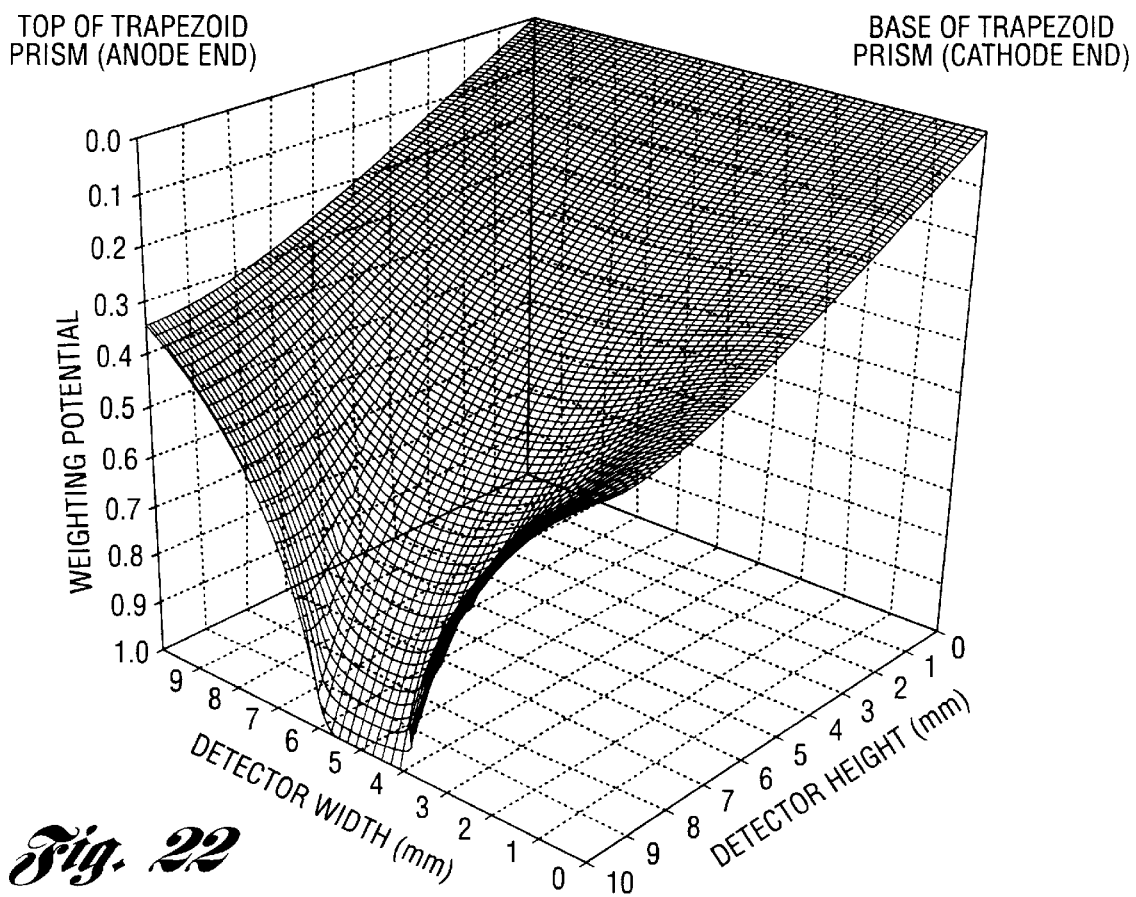
FIG. 22 shows weighting potential for a CdZnTe trapezoid prism detector without a Frisch grid; a distance of 10 mm separates the small anode from the much larger cathode; charge induction is greatest in the region nearest the small anode, an effect known as the "small pixel effect"

FIG. 22 shows the weighting potential of the trapezoid prism device described in Part A. As can be seen, the change in induced charge is greatest in the region near the anode. Hence, electron dominated pulses result without even having a Frisch grid on the device.

Figure 23A:
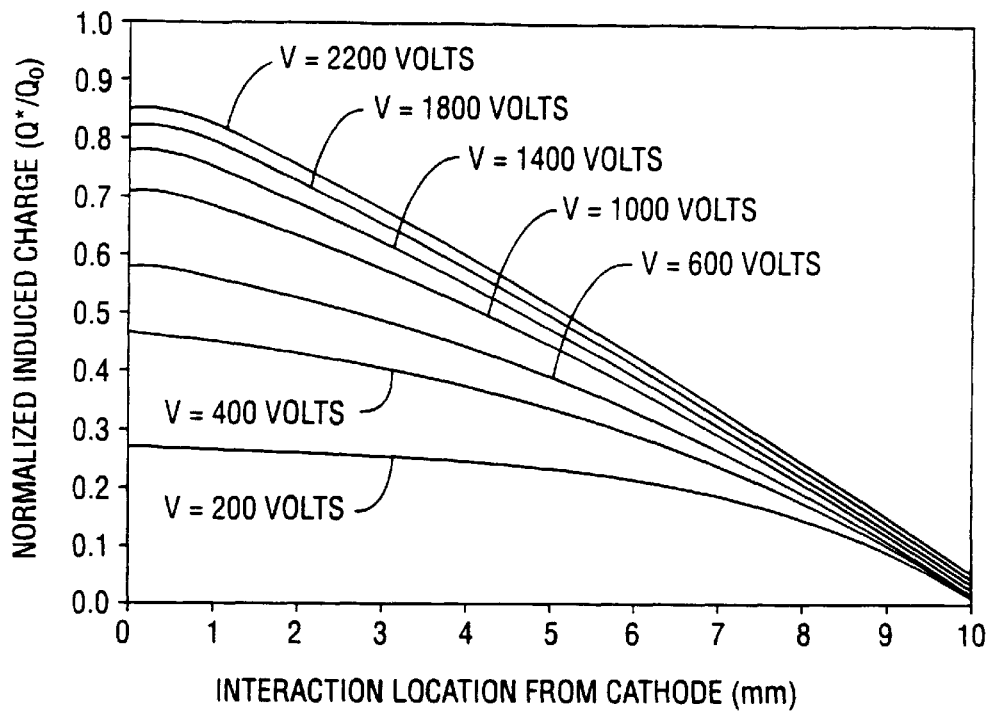
FIGS. 23a and 23b show a comparison of charge induction maps for a (a) CdZnTe planar radiation detector and a (b) CdZnTe trapezoid prism detector, respectively; a distance of 10 mm separates the anode from the cathode in both cases.
Figure 23B:
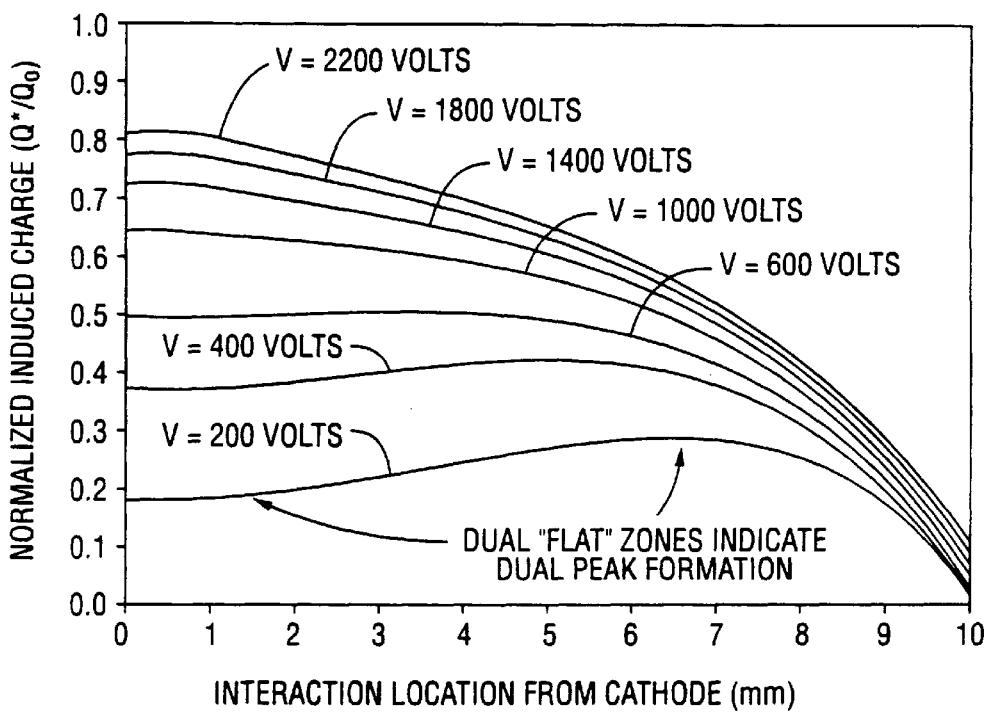

FIGS. 23a and 23b show a comparison between the charge induction map of a 10 mm wide planar CdZnTe detector and that of a 10 mm wide (height) CdZnTe trapezoid prism device (dimensions described in Part A) Typically quoted properties of CdZnTe were used for the calculations. As can be seen, the trapezoid prism has a much larger "flat" region than the planar device. Coupling the charge induction response with the interaction probability distribution function in a trapezoid detector yields a much different spectral response than that of a planar device.

Figure 24:
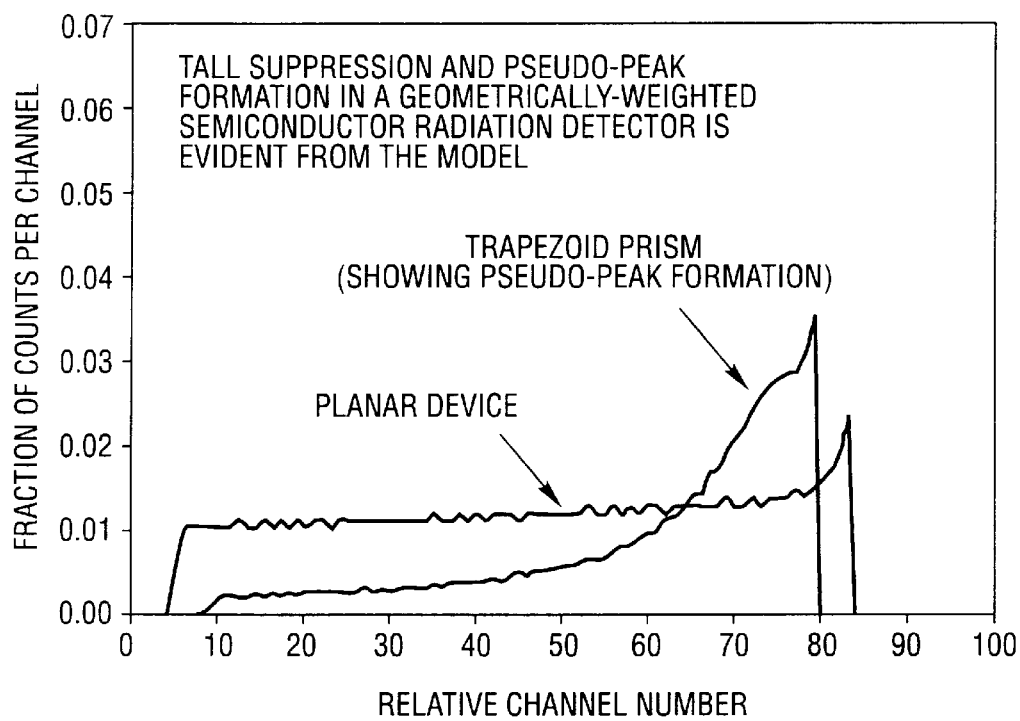
FIG. 24 shows modeled results of the expected pulse height spectrum from a CdZnTe planar detector and a CdZnTe trapezoid prism geometrically weighted detector; the distance between the anode and the cathode in both cases is 10 mm; Compton scattering and gamma ray attenuation were excluded from the model.

FIG. 24 shows a comparison of a simulated gamma ray spectrum from a planar device. As can be seen, the "tail" is significantly suppressed in the trapezoid device, and a "pseudo-peak" forms as a natural consequence of the coupling between geometrical weighting and the small pixel effect.

Figure 25:
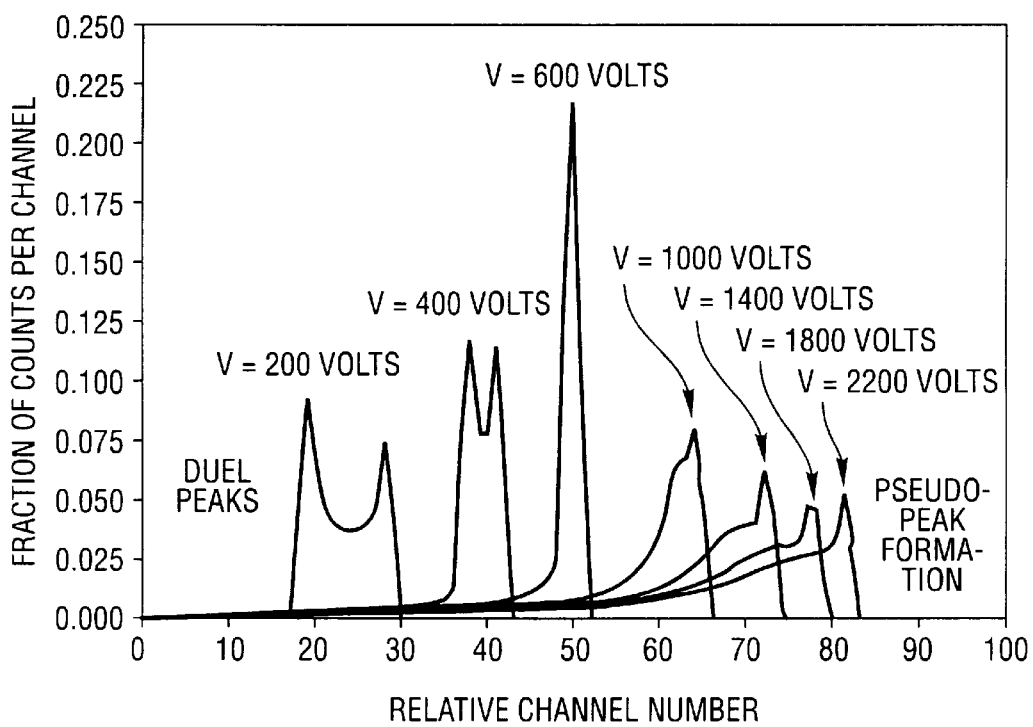
FIG. 25 is a modeled voltage dependent pulse height spectrum of a mono-energetic gamma ray source from a CdZnTe trapezoid prism geometrically weighted detector; the distance between the anode and the cathode is 10 mm; there is a unique formation of dual peaks at low voltages and a pseudo-peak at high voltages; Compton scattering and gamma ray attenuation were excluded from the model.

Pseudo-peak formation from such a device is modeled and shown in FIG. 25. The CdZnTe trapezoidal detector was modeled with typically quoted values for CdZnTe. Shown is the expected spectral dependence as a function of increasing bias voltage across the trapezoid device. Compton scattering and gamma ray attenuation were not considered in the calculation. The model predicts the formation of "dual peaking" or "satellite" peaks at low voltages. This can be recognized as a direct consequence of the unusual charge induction dependence shown in FIG. 23b, in which there are two flat regions that appear in the charge induction map for the trapezoid detector. As the voltage is increased, the resolution at first gets much better. At higher voltages, the resolution degrades and a full "pseudo-peak" forms near the location expected for the actual gamma ray full energy peak.

Figure 26:
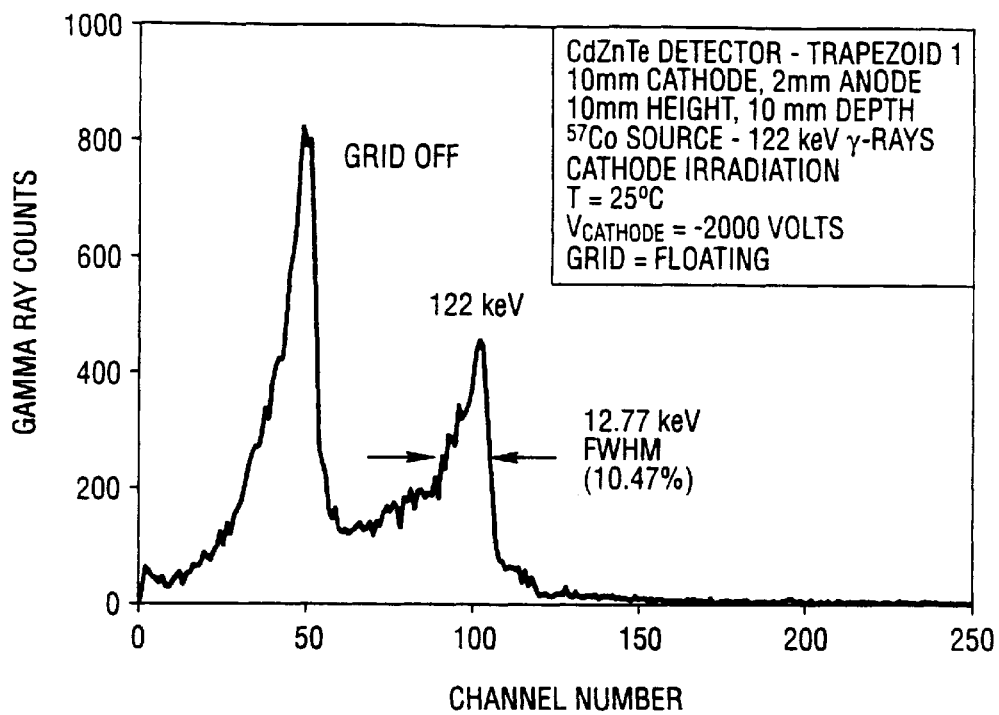
FIG. 26 is the observed voltage dependent pulse height spectrum of 122 keV gamma rays from a CdZnTe trapezoid prism geometrically weighted detector with the Frisch grid turned off; the distance between the anode and the cathode is 10 mm; the dual peaking phenomenon is clearly shown; it is suspected that the voltage distribution is very low across most of the detector due to bad electrical contacts.

FIG. 26 shows the spectral response from 122 kev $^{57}$Co gamma rays of a geometrically weighted CdZnTe Frisch grid detector (manufactured by eV Products) with the grid "off" (floating). The device has the same dimensions as described in Part A. As can be seen, two peaks appear for one gamma ray energy, a predicted response for low voltages. Yet the applied voltage is 2000 volts, indicating that the voltage is not being dropped across the device uniformly, a general indication of bad electrical contacts. Satellite peaks were observed for all gamma ray energies tested when the grid was "off". The satellite peaks in all cases disappear when the Frisch grid is turned on.

Figure 27:
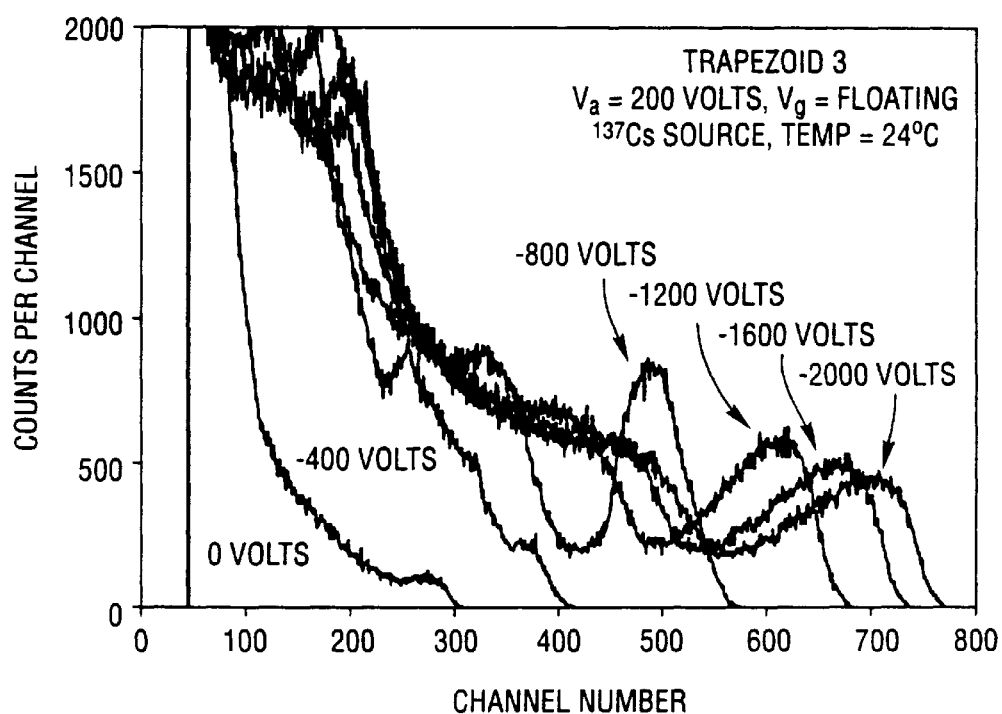
FIG. 27 is the observed voltage dependent pulse height spectrum of 662 keV gamma rays from a CdZnTe trapezoid prism geometrically weighted detector with the Frisch grid turned off; the distance between the anode and the cathode is 10 mm; dual peaks form at low voltages, and a pseudo-peak forms at high voltages; the anode was held at 200 volts and the cathode voltage was changed for the experiment.

FIG. 27 shows full pseudo-peak formation from a trapezoid device, in which 662 keV gamma rays are measured from a $^{137}$Cs source. The device has the same dimensions as described in Part A except that it is 17 mm long instead of only 10 mm long. The trapezoidal device exhibited the entire response as predicted from FIG. 25, indicating that the contacts on the device are much better than the eV Products manufactured device.

The Frisch Grid Effect

The effect of a Frisch grid has been covered in the previous sections and will not be repeated here. Ultimately, it is the device operating with the Frisch grid "on" that allows for the highest performance.

Figure 28:
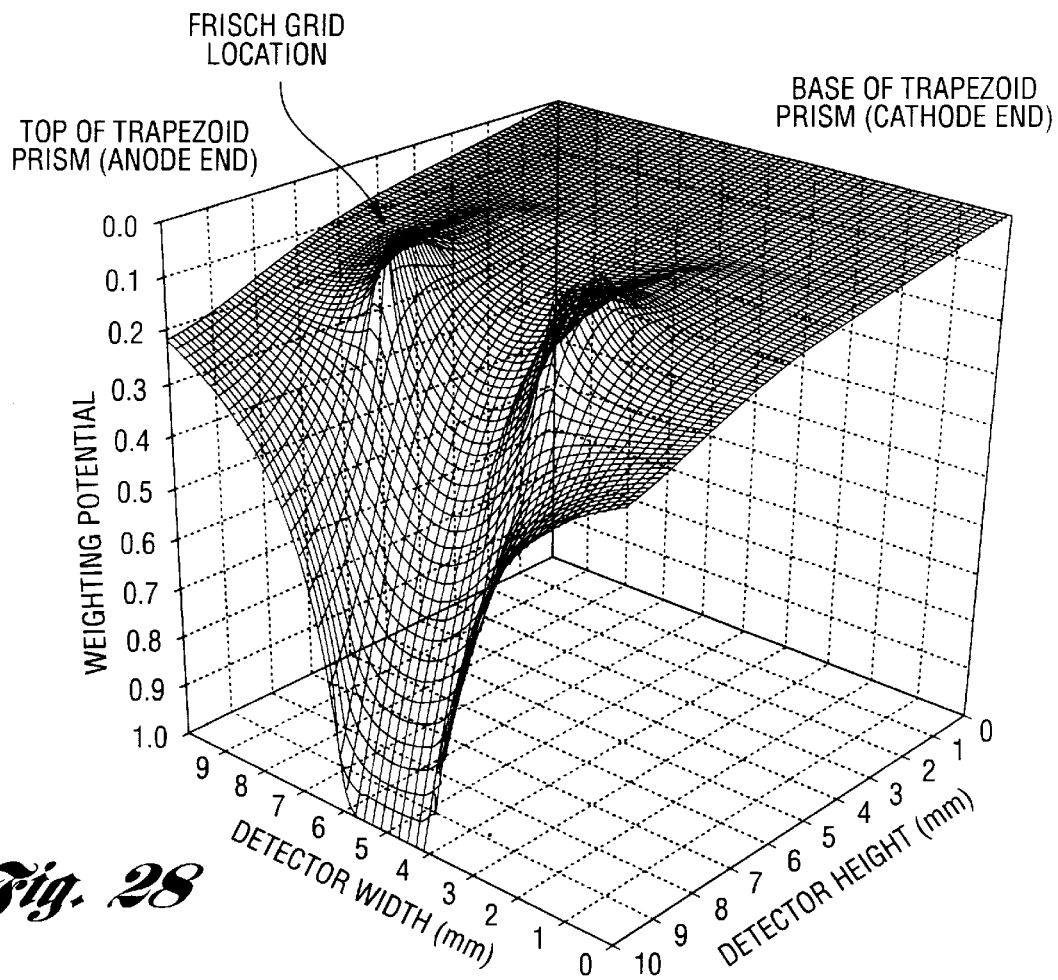
FIG. 28 is a weighting potential for a CdZnTe trapezoid prism detector with the Frisch grid turned on; a distance of 10 mm separates the small anode from the much larger cathode; the Frisch grid works to effectively screen induced charge from charge carrier motion in the interaction region; hence, it is primarily the charges moving in the measurement region between the Frisch grid and the anode that will induce charge on the external pre-amplifier circuit.

FIG. 28 shows the weighting potential of a trapezoid prism Frisch grid radiation spectrometer with the Frisch grid turned "on". Clearly, the outstanding screening for such a device is evident. With the Frisch grid turned "on", the device maintains highly effective interaction region screening while maintaining a much larger interaction region than the planar parallel Frisch grid design.

Figure 29:
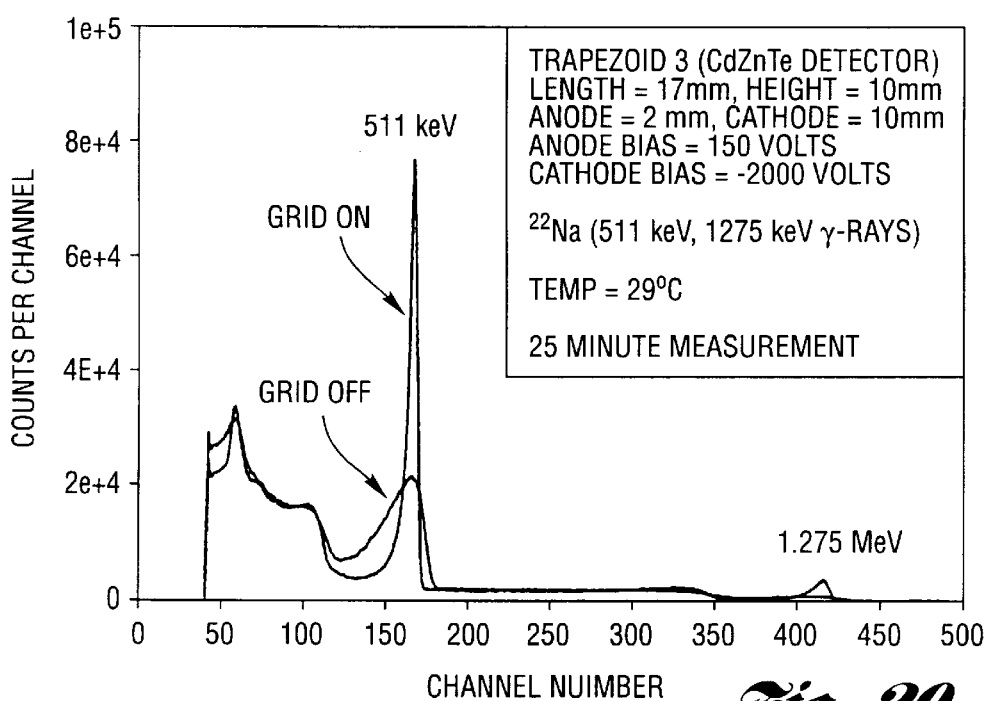
FIG. 29 shows comparison spectra of 511 keV gamma rays from $^{22}$Na as measured with a CdZnTe trapezoid prism detector with the Frisch grid turned off and on; shown is the distinct advantage to having the Frisch grid on such a device; the resolution improvement is significant and results from the composite effects of the geometrical weighting, the small pixel effect, and the Frisch grid effect.
Figure 30:
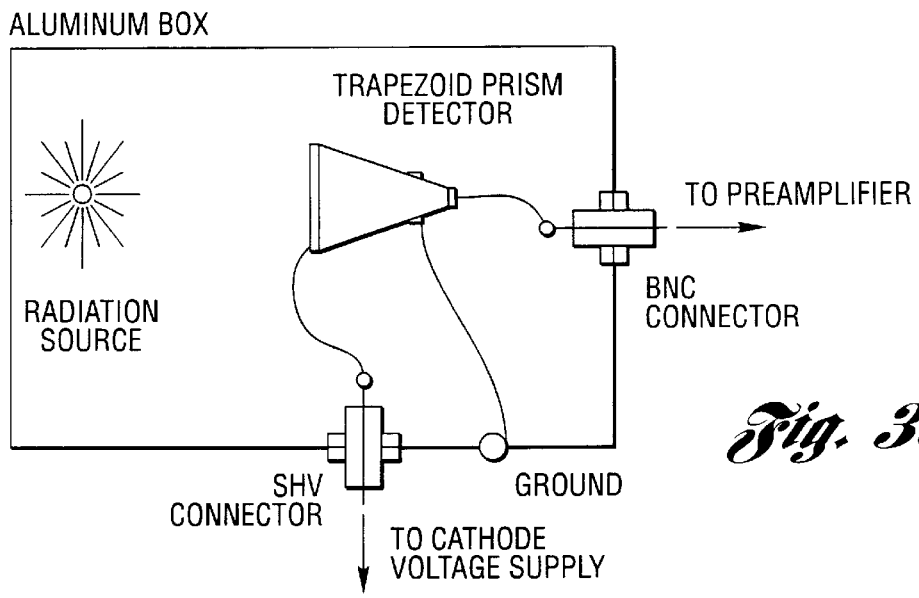
FIG. 30 is a schematic view of a trapezoid Frisch grid detector set up for gamma ray spectroscopy; the simple connections are rugged and easy to implement.

FIG. 29 shows two room temperature (29° C.) spectra of 511 keV $^{22}$Na annihilation gamma rays, one with the Frisch Grid turned "off" and the other with the Frisch grid turned "on". The CdZnTe geometrically weighted trapezoid prism device is the 17 mm long trapezoid prism detector. As can be seen, the resolution improvement is significant and results from the composite effects of the geometrical weighting, the small pixel effect, and the Frisch grid effect. The device was fabricated from "counter grade" material.

Section 5. Observed Spectral Results

It is the final observed gamma ray spectra that determines the usefulness of a detector for gamma ray spectroscopy. Numerous gamma ray spectra were taken at various temperatures (all at or above 23° C.) from a 1 cm$^3$ CdZnTe trapezoid prism geometrically weighted Frisch grid radiation detector. The device had dimensions of:

Anode width=2 mm
Cathode width=10 mm
Height=10 mm
Length=17 mm

Figure 31:
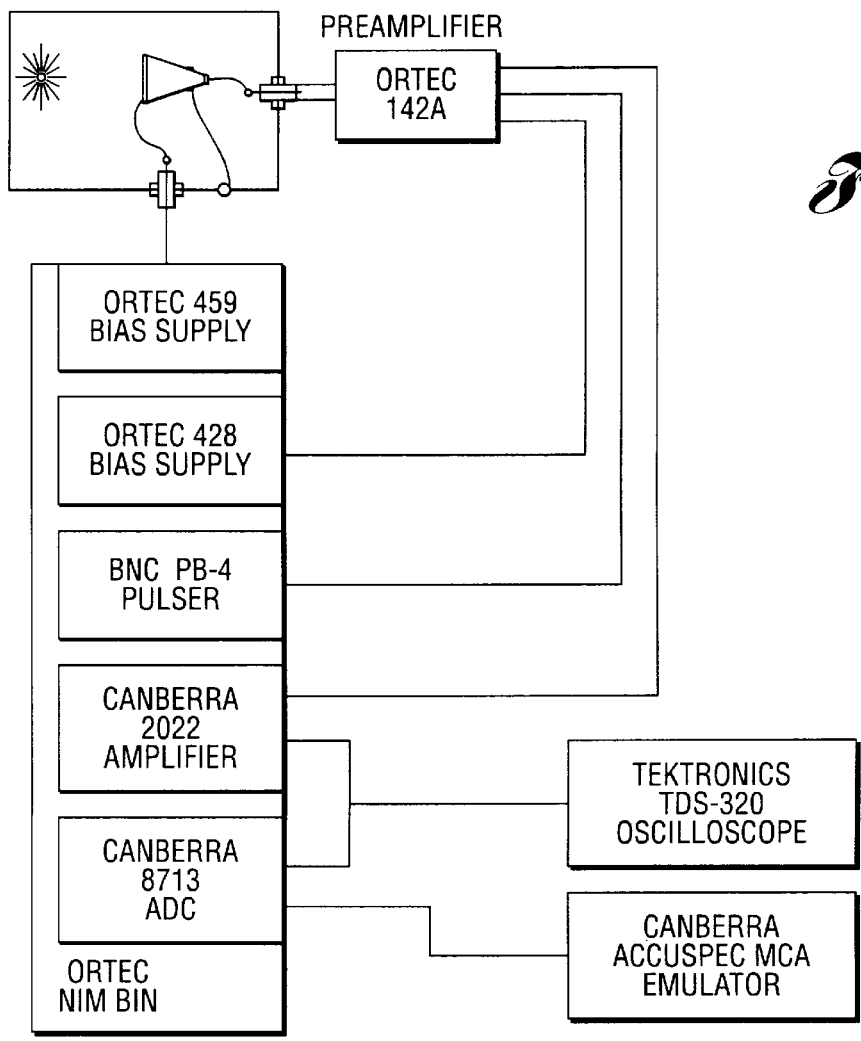
FIG. 31 is a schematic view of electronic components and set up used to test trapezoid Frisch grid detectors.

The bulk CdZnTe used was "counter grade" material acquired from eV Products. Generally, "counter grade" material is regarded as unfit for fabrication into radiation spectrometers. The device was tested using only conventional, commercially-available, NIM electronics, and was hooked directly to a single standard Ortec 142A preamplifier, as illustrated in FIG. 31. No electronic pulse correction, rejection or compensation was used. The spectra came directly from pulses shaped by an Ortec 142A preamplifier and a Canberra 2022 amplifier. The detector was operated at room temperature and no detector cooling in any fashion was performed.

The device performed very well at room temperature and did not require cooling in order to observe outstanding results. Additionally, high resolution was achieved without electronic pulse rejection, compensation and correction techniques. The device operated with standard NIM electronics and with only a standard Ortec 142A charge sensitive preamplifier attached directly to the detector anode. There is no need for a custom preamplifier or coupling circuit to achieve very good results, although such a circuit may improve the device performance. Presently, room temperature gamma ray energy resolution observed from the device include:

7.5% FWHM at 122 keV (T=29° C.)
3.5% FWHM at 511 keV (T=29° C.)
2.68% FWHM at 662 keV (T=23° C.)
2.45% FWHM at 1.332 MeV (T=24° C.)

Figure 32:
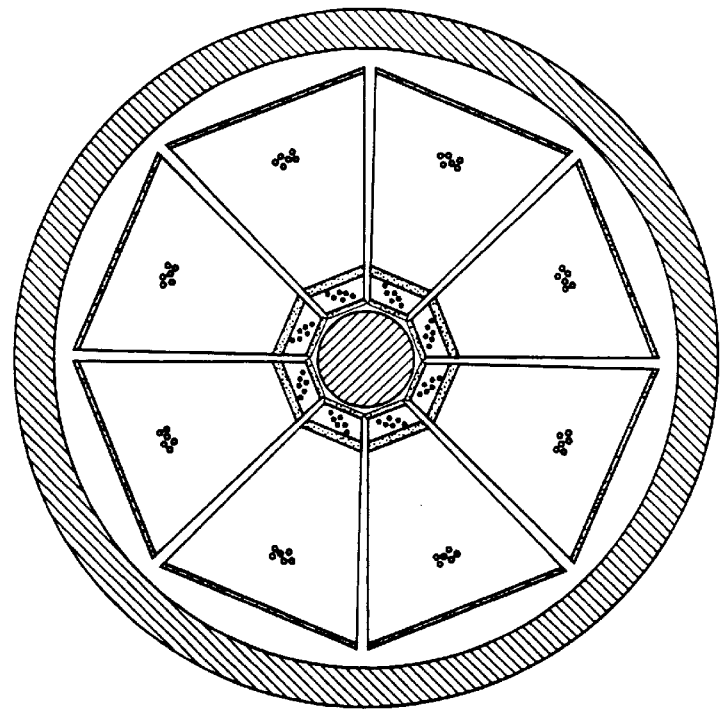
FIG. 32 is a possible pseudo-coaxial array of geometrically weighted parallel strip Frisch grid detectors; a tungsten shield can be inserted into the coaxial central hole to provide gamma ray shielding from oppositely placed detectors, thereby allowing the device to accumulate position information of external neutron sources; an outer lead collar can be used to help reduce external gamma ray background.

The shape of the proposed geometrically weighted semiconductor Frisch grid detectors allows for a compact arrangement of the devices into a pseudo-coaxial design as illustrated in FIG. 32. Multiple detectors can be linked together to produce a large volume device. Connecting many devices together and correcting for slight differences in performance has been demonstrated with a very simple resistor network, hence still only one preamplifier is necessary to operate the pseudo-coaxial device array. Overall the device is a compact, room-temperature-operated, high energy resolution, high gamma ray efficiency detector that needs only conventional electronics to operate.

Additionally, the geometric weighting effect can be coupled to the present co-planar grid technology to produce a geometrically weighted co-planar grid radiation detector. Here the devices operate in the same manner as described for the Frisch grid devices, except that the single polarity sensing is performed with the co-planar grid cubic or planar styled detectors.

Presently, the co-planar grid radiation detector is the device type that has demonstrated the highest resolution for room temperature operated compound semiconductor radiation detectors. Yet, the device is difficult to fabricate and reproduce, and it often requires more than one output preamplifier to differentiate the signal (thereby producing the single polarity sensing effect). The new device, the geometrically weighted semiconductor Frisch grid radiation detector, offers a very easy to fabricate and reproducible method of single polarity sensing. Additionally, the device requires only one output to a conventional commercially available preamplifier. The new device can also be arranged in a pseudo-coaxial or pseudo-spherical design to help facilitate compactness for a detector array.

The new invention allows for room-temperature-operated semiconductor radiation detectors to supply high-resolution spectroscopic information about gamma ray sources, charged particles sources, or other sources of ionizing radiation. Such devices can be used for medical probes, remote survey units, remotely located radiation monitors, personal dosimetry meters, or any other application requiring a room temperature operated high resolution semiconductor gamma ray or radiation spectrometer.

Figure 33:
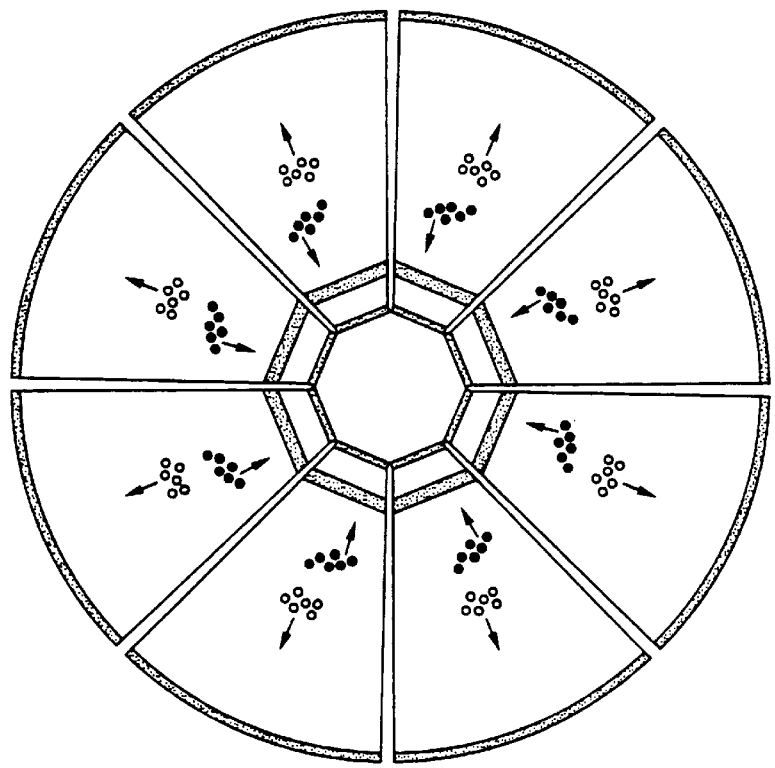
FIG. 33 is a sectional view of a spherical array of detectors each of which has a rounded based.

Referring now to FIGS. 32 and 33, there are illustrated two arrays of geometrically weighted Frisch Grid single-carrier radiation spectrometers. Trapezoidal shape allows for good packing of detectors in the array in order to form a large device or system. In FIG. 33, the rounded bases of the interaction regions allow for more uniformity with carrier transport within the interaction region.

Shown in FIG. 33 is one possible packing array design that can be used with trapezoidal shaped detectors. As can be seen, the trapezoidal shapes can be arranged to produce a pseudo-spherical device. Shown is one possible configuration in which eight detectors compose the completed spherical array detection device. The rounded bases of the interaction regions demonstrate the possible configuration of a pseudo-spherical detector array design.

The bottom of each base is rounded which creates a situation in which the electrons or holes will have less fluctuation in travel distance in the near base region. Additionally, the electric field will be more uniform than in the trapezoidal, pyramidal, or frustum (conical) devices. The device takes advantage of:

1. The shape insures that one carrier is dominant by mere statistics, i.e. more events occur in the base region than the upper grid ring region, therefore more charge carriers are transported from the base to the grid ring than vice versa.
2. The grid takes advantage of the Frisch grid effect, in which only the charge carriers excited in the base region that reach the grid ring can produce a pulse for the external circuit to measure.
3. The region above the grid ring, the measurement region, can have a higher electric field than the base region, therefore insuring that the electric field and weighting potential are intensified in the measurement region.
4. The rounded bottom is designed to reduce transport length fluctuations that may appear in the trapezoidal, pyramidal, or frustum (conical) designs.

Figure 34:
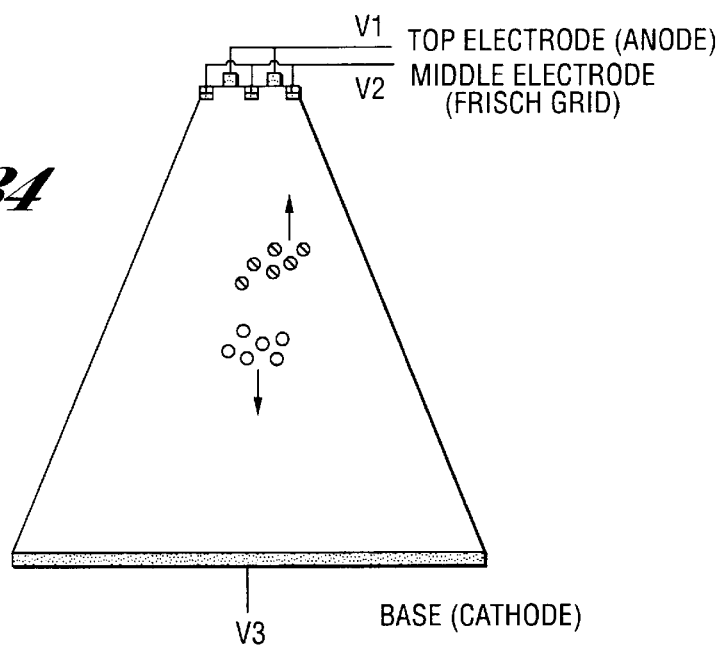
FIG. 34 is a schematic view of a geometrically-weighted, etched-trench, Frisch grid single carrier radiation spectrometer.

Referring now to FIG. 34 there is illustrated an etch trench Frisch grid device. The geometry used shows a larger cathode than the anode. However, the case could also be made in which the anode is larger than the cathode. Any shape with one end larger than the other qualifies as a geometrically weighted device.

The etch trench device of FIG. 34 is an advanced form of the parallel strip Frisch grid device of FIGS. 1–4. Instead of stacking the devices in intimate contact, the individual Frisch components are fabricated by a series of etched trenches into the substrate. The contacts behaving as the Frisch grid are applied to the bottom of the device etched trenches or wells, and the collecting contacts are applied to the top of the device "towers".

The device takes advantage of:
1. The shape insures that one carrier is dominant by mere statistics, i.e., more events occur near the base region than the measurement region, therefore more charge carriers are transported from the base to the Frisch grid than vice versa.
2. The grid takes advantage of the Frisch grid effect, in which only the charge carriers excited in the base region that pass through the Frisch grid will produce a pulse for the external circuit to measure.

3. The measurement region can have a higher operating electric field than the base region, therefore insuring that the electric field and weighting potential are intensified in the measurement region.

4. The etched trench pattern with the electrodes "toggled" in and out of the trenches produces a real Frisch grid with a tighter grid formation than the parallel strip or concentric Frisch grid. The new design helps to reduce the overall leakage current between the grids, thereby allowing for higher differential voltages to be applied between the grids. Additionally, the Frisch grid screening effect is improved over the single module parallel or concentric designs. These effects improve the overall charge carrier collection and the device radiation energy resolution.

Figure 35:
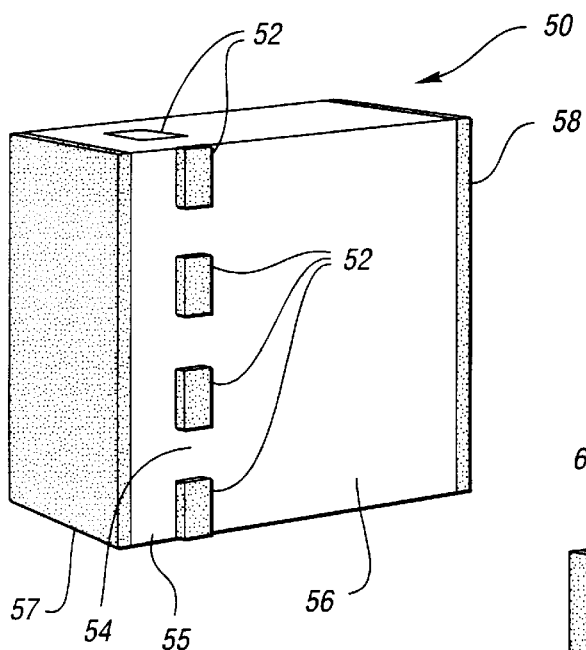
FIG. 35 is a perspective view of a detector of the present invention having concentric and segmented Frisch grid strips.

FIG. 35 discloses a version of a Frisch grid detector, generally indicated at 50, formed through outside contacts. The detector 50 includes concentric and segmented Frisch grid strips 52, a pervious region 54, a measurement region 55, and an interaction region 56. The device 50 also includes a contact 57 to the measurement region 55 and a contact or electrode 58 to the interaction region 56.

Figure 36:
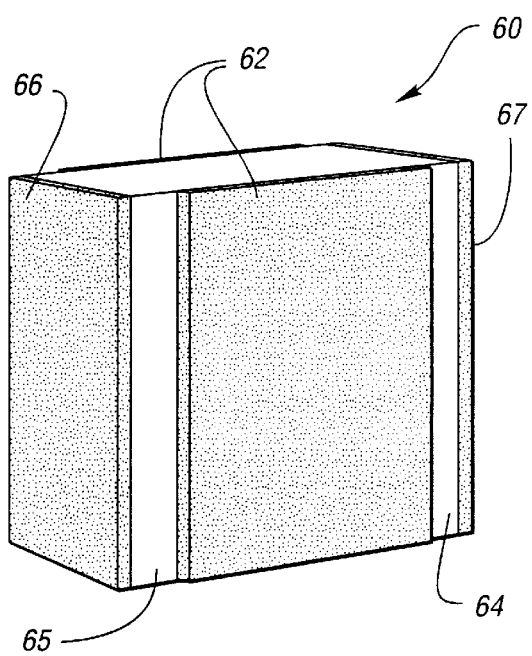
FIG. 36 is a perspective view of a detector of the present invention having relatively wide parallel Frisch grid strips.

Referring now to FIG. 36, there is illustrated another version of a Frisch grid detector 60 formed through outside contacts. The detector 60 has a very wide or large pervious region.

The detector 60 includes grid contacts 62 to the wide pervious region. The detector 60 also includes an interaction region 64, a measurement region 65, and a contact 66 to the measurement region 65. Device 60 also includes a contact 67 to the interaction region 64.

Figure 37A:
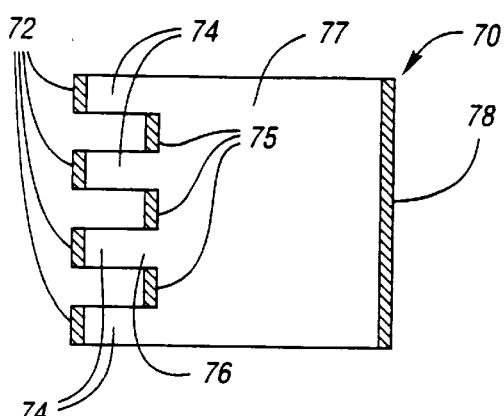
FIGS. 37a–37c are side elevational perspective views of three different trenched type semiconductor Frisch grid radiation detectors.
Figure 37B:
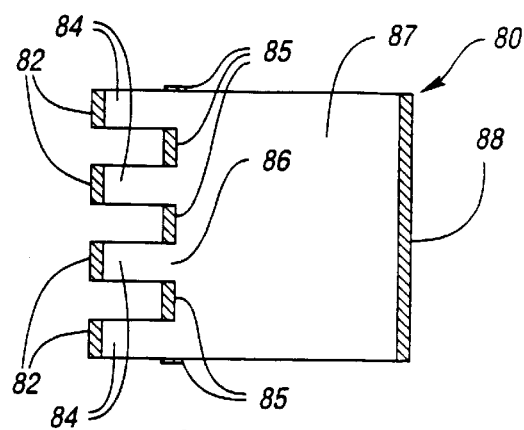
Figure 37C:
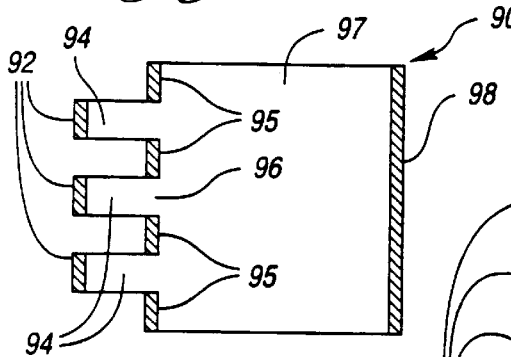

Referring now to FIGS. 37a–37c, there are illustrated sample profiles of trench-type semiconductor Frisch grid radiation detectors, generally indicated at 70, 80 and 90, respectively. The detectors 70, 80 and 90 include top contacts 72, 82 and 92, respectively. The devices 70, 80 and 90 also include measurement regions 74, 84 and 94, respectively. Furthermore, the devices 70, 80 and 90 include Frisch grids 75, 85 and 95, respectively. For each of the devices 70, 80 and 90, the Frisch grids 75, 85 and 95 define pervious regions 76, 86 and 96, respectively.

The devices 70, 80 and 90 further include interaction regions 77, 87 and 97, respectively. Still further, the devices 70, 80 and 90 include bottom contacts 78, 88 and 98, respectively.

Figure 38:
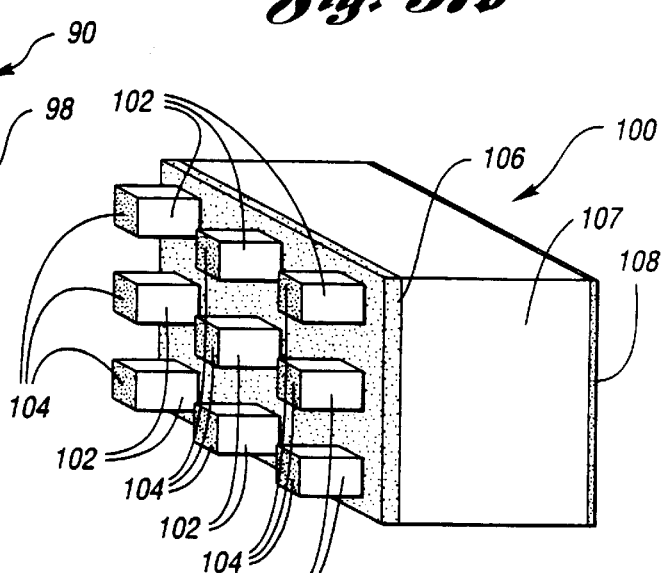
FIG. 38 is a perspective view of a segmented depression or trench type semiconductor Frisch grid detector.

Referring now to FIG. 38, there is disclosed a detector 100 which is of a segmented, depression type or trench-type semiconductor Frisch grid detector wherein the trenches run in different directions, thereby isolating measurement region towers 102. On top of each of the towers 102 is a top contact 104.

The device 100 also includes a Frisch grid contact 106, a pervious region under the Frisch grid contact 106, an interaction region 107, and a bottom contact 108.

Figure 39:
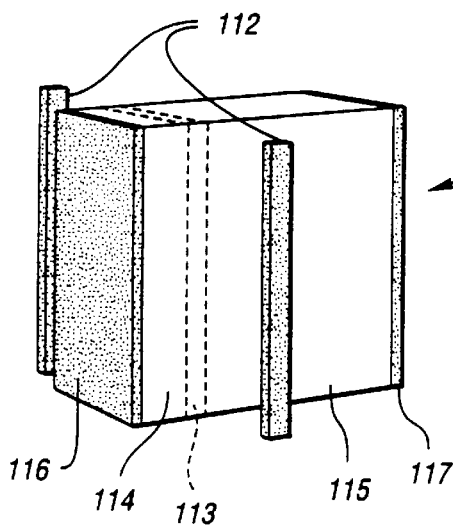
FIG. 39 is a perspective view of a detector including a semiconductor substrate which does not contact external Frisch grid strips.
Figure 40:
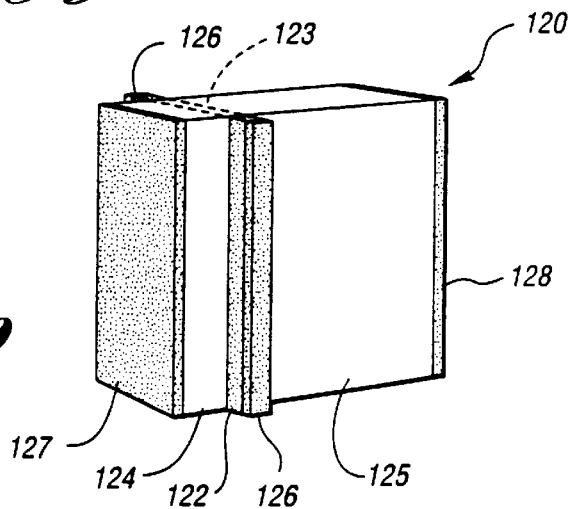
FIG. 40 is a perspective view similar to FIG. 39 including insulating material between the pervious region of the substrate and the external strips.

Referring now to FIGS. 39 and 40, there are disclosed at 110 and 120 examples of semiconductor Frisch grid radiation detectors with non-contacting outside contacts or electrodes. In particular, with reference to FIG. 39, the device 110 includes a pair of external, non-contacting Frisch grid strips 112 which define a pervious region 113. The device 110 also includes a measurement region 114 and an interaction region 115. Still further, the device 110 includes a contact 116 to the measurement region 114 and a contact 117 to the interaction region 115.

Referring specifically to FIG. 40, the device 120 is similar to the device 110 of FIG. 39, except that the device 120 includes a layer of insulating material 122 on a pervious region 123. The device 120 further includes a measurement region 124 and an interaction region 125.

The device 120 also includes external, non-contacting Frisch grid strips 126 which are spaced from the pervious region 123 by the insulating material 122. The device 120 further includes a contact 127 to the measurement region 124 and a contact 128 to the interaction region 125.

Referring now collectively to FIGS. 41 and 42, there are illustrated examples of semiconductor Frisch grid radiation detectors with non-contacting outside contacts or electrodes, generally indicated at 130 and 140, respectively.

Referring specifically to the device of FIG. 41, the device 130 includes a pervious region 131 defined by an external and non-contacting Frisch grid ring 132. The pervious region 131 separates a measurement region 133 from an interaction region 134.

The device 130 also includes a contact 135 to the measurement region 133 and a contact 136 to the interaction region 134.

Referring specifically to FIG. 42, the device 140 also includes an external, non-contacting Frisch grid ring 141 which defines a pervious region 142. However, the device 140 further includes an insulating filling 143. The device 140 also includes a measurement region 144 and an interaction region 145.

The device 140 also includes a contact 146 to the measurement region 144 and a contact 147 to the interaction region 145.

Referring now to FIG. 43, there is illustrated a detector or device 150 which may be hemispherical or cylindrical in shape. The Frisch grid detector 150 may be implemented with a buried structure, entrenched or depressed structure or a membrane structure. The device 150 is a wide angle (180°) semiconductor Frisch grid detector with an etched style Frisch grid 152 and small measurement region contacts 154. The detector 150 includes a measurement region 155, a pervious region 156, and an interaction region 157. The device 150 also includes a contact 158 to the interaction region 157.

Referring now to FIG. 44, there is illustrated a device 160 which is a semiconductor Frisch grid radiation detector with a buried membrane-type Frisch grid region 162. The region or grid 162 is defined by a membrane which is very thin and acts like a Frisch grid as well as a pervious region. The grid 162 may be made from a very thin metal or a very thin semiconductor. The grid may form a rectifying contact to the main material of the detector's interaction and/or measurement regions as illustrated in FIG. 44. Charge carriers are accelerated to the membrane 162 and punch through or tunnel through the membrane 162 and into the measurement region.

The device 160 also includes a contact 164 to the interaction region and a contact 166 to the measurement region.

While the best mode for carrying out the invention has been described in detail, those familiar with the art to which this invention relates will recognize various alternative designs and embodiments for practicing the invention as defined by the following claims.

What is claimed is:

1. A high-resolution, ionization detector comprising:
   an ionization substrate having a first surface and a second surface opposing the first surface;
   a first electrode disposed at the first surface;
   a second electrode disposed at the second surface;
   a reference pattern of conductive or semiconductive material which divides the ionization substrate into an interaction region, a measurement region and a pervious region which separates the interaction and measurement regions wherein the pervious region defines a reference plane to measure charge carrier movement in the measurement region and directs charge carrier flow within the substrate;

voltage potential circuits for applying voltage potentials to the reference pattern of material and to the first and second electrodes so that a bias voltage is applied across substantially the entire substrate and so the voltage potential applied to the reference pattern is between the voltage potentials applied to the first and second electrodes, wherein charge carriers of a first polarity type move from the interaction region, through the pervious region and into the measurement region; and a signal measurement circuit for measuring at the second electrode a signal generated by the charge carriers of the first polarity type moving from the interaction region, through the pervious region and within the measurement region between the pervious region and the second surface wherein the substrate also has a third surface and a fourth surface opposing the third surface between the first and second surfaces and wherein the reference pattern includes a first strip disposed at the third surface and a second strip disposed at the fourth surface.

2. The detector as claimed in claim 1 wherein the reference pattern is a grid.

3. The detector as claimed in claim 2 wherein the grid is a Frisch grid.

4. The detector as claimed in claim 3 wherein the Frisch grid includes at least two strips of conductive or semiconductive material.

5. The detector as claimed in claim 4 wherein the at least two strips are substantially parallel.

6. The detector as claimed in claim 5 wherein the at least two strips are spaced two millimeters or less apart.

7. The detector as claimed in claim 3 wherein the Frisch grid includes concentric and segmented strips.

8. The detector as claimed in claim 3 wherein the Frisch grid includes a pair of substantially parallel strips and wherein the pervious region is substantially larger than the measurement region.

9. The detector as claimed in claim 2 wherein the grid includes at least two substantially parallel strips.

10. The detector as claimed in claim 1 wherein the material of the reference pattern is P-type, semiconductor material.

11. The detector as claimed in claim 10 wherein the reference pattern is a grid of P-type semi-conductor material buried in the substrate.

12. The detector as claimed in claim 1 wherein the material of the reference pattern is N-type, semiconductor material.

13. The detector as claimed in claim 12 wherein the reference pattern is a grid of N-type semiconductor material buried in the substrate.

14. The detector as claimed in claim 1 wherein the reference pattern includes at least two strips having substantially the same voltage potential applied thereto.

15. The detector as claimed in claim 1 wherein the detector is a radiation detector.

16. The detector as claimed in claim 15 wherein the radiation detector is a semiconductor, single-charge carrier, radiation detector and wherein the substrate is a semiconductor substrate.

17. The detector as claimed in claim 16 wherein the semiconductor substrate is CdZnTe semiconductor substrate.

18. The detector as claimed in claim 17 wherein the detector is a room temperature, gamma ray detector.

19. The detector as claimed in claim 1 wherein the signal measurement circuit includes a single preamplifier circuit.

20. The detector as claimed in claim 1 wherein the first electrode is substantially larger than the second electrode.

21. The detector as claimed in claim 1 wherein the substrate is shaped like a trapezoid.

22. The detector as claimed in claim 1 wherein the substrate is shaped like a pyramid frustum.

23. The detector as claimed in claim 1 wherein the substrate is shaped like a conical frustum.

24. The detector as claimed in claim 1 wherein the first surface is a curved surface.

25. The detector as claimed in claim 1 wherein the second surface has a plurality of trenches formed therein separated by towers and wherein the reference pattern is formed in the trenches and the second electrode is formed on the towers so that the reference pattern is a Frisch grid.

26. The detector as claimed in claim 25 wherein the plurality of trenches extend in different directions to substantially isolate the towers.

27. The detector as claimed in claim 25 wherein the first surface is a curved surface.

28. The detector as claimed in claim 27 wherein the substrate also has a third surface and a fourth surface opposing the third surface between the first and second surfaces and wherein the third and fourth surfaces are substantially coplanar.

29. An array of detectors wherein each of the detectors is a detector as claimed in claim 1 wherein the substrates of the detectors are formed from either a single crystal or an amorphous material.

30. An array of detectors wherein each of the detectors is a detector as claimed in claim 1 wherein the substrates of the detectors are formed from either separate crystals or amorphous materials.

31. The array as claimed in claim 30 wherein the detectors are arranged so that the array forms a substantially coaxial or spherical device.

32. The detector as claimed in claim 1 wherein the reference pattern is a membrane buried in the substrate and wherein charge carriers of the first polarity type punch through or tunnel through the membrane and into the measurement region.

33. A high-resolution, ionization detector comprising:

an ionization substrate having a first surface and a second surface opposing the first surface;

a first electrode disposed at the first surface;

a second electrode disposed at the second surface;

a reference pattern of conductive or semiconductive material which divides the ionization substrate into an interaction region, a measurement region and a pervious region which separates the interaction and measurement regions wherein the pervious region defines a reference plane to measure charge carrier movement in the measurement region and directs charge carrier flow within the substrate;

voltage potential circuits for applying voltage potentials to the reference pattern of material and to the first and second electrodes so that a bias voltage is applied across substantially the entire substrate and so the voltage potential applied to the reference pattern is between the voltage potentials applied to the first and second electrodes, wherein charge carriers of a first polarity type move from the interaction region, through the pervious region and into the measurement region; and a signal measurement circuit for measuring at the second electrode a signal generated by the charge carriers of the first polarity type moving from the interaction region, through the pervious region and within the measurement region between the pervious region and the second surface wherein the substrate also has a third surface and a fourth surface opposing the third surface between the first and second surfaces and wherein the reference pattern is a Frisch grid ring disposed at the third and fourth surfaces.

34. A high-resolution, ionization detector comprising:

an ionization substrate having a first surface and a second surface opposing the first surface;

a first electrode disposed at the first surface;

a second electrode disposed at the second surface;

a reference pattern of conductive or semiconductive material which divides the ionization substrate into an interaction region, a measurement region and a pervious region which separates the interaction and measurement regions wherein the pervious region defines a reference plane to measure charge carrier movement in the measurement region and directs charge carrier flow within the substrate;

voltage potential circuits for applying voltage potentials to the reference pattern of material and to the first and second electrodes so that a bias voltage is applied across substantially the entire substrate and so the voltage potential applied to the reference pattern is between the voltage potentials applied to the first and second electrodes, wherein charge carriers of a first polarity type move from the interaction region, through the pervious region and into the measurement region; and a signal measurement circuit for measuring at the second electrode a signal generated by the charge carriers of the first polarity type moving from the interaction region, through the pervious region and within the measurement region between the pervious region and the second surface wherein the substrate also has a third surface and a fourth surface opposing the third surface between the first and second surfaces and wherein the reference pattern is a non-contacting Frisch grid spaced away from the third and fourth surfaces.

35. The detector as claimed in claim 34 further comprising insulating material disposed between the non-contacting Frisch grid and the third and fourth surfaces.

36. The detector as claimed in claim 34 wherein the non-contacting Frisch grid includes a pair of substantially parallel strips.

37. The detector as claimed in claim 34 wherein the non-contacting Frisch grid is a Frisch grid ring.

\* \* \* \* \*